United States Patent
Ukawa et al.

(10) Patent No.: US 10,873,015 B2
(45) Date of Patent: Dec. 22, 2020

(54) LIGHT EMITTING DEVICE AND METHOD OF MANUFACTURING THE LIGHT EMITTING DEVICE

(71) Applicant: NICHIA CORPORATION, Anan (JP)

(72) Inventors: Hiroaki Ukawa, Itano-gun (JP); Ryo Iwasa, Anan (JP)

(73) Assignee: NICHIA CORPORATION, Anan (JP)

( * ) Notice: Subject to any disclaimer, the term of this patent is extended or adjusted under 35 U.S.C. 154(b) by 56 days.

(21) Appl. No.: 16/288,464

(22) Filed: Feb. 28, 2019

(65) Prior Publication Data
US 2019/0273195 A1    Sep. 5, 2019

(51) Int. Cl.
*H01L 29/18* (2006.01)
*H01L 33/00* (2010.01)
(Continued)

(52) U.S. Cl.
CPC ............ *H01L 33/62* (2013.01); *H01L 23/544* (2013.01); *H01L 23/562* (2013.01); *H01L 24/48* (2013.01);
(Continued)

(58) Field of Classification Search
CPC ..... H01L 23/49575; H01L 2224/16245–1626; H01L 2224/32245–3226; H01L 21/565–566; H01L 23/3142; H01L 33/62; H01L 33/486; H01L 33/502; H01L 33/56; H01L 33/60; H01L 23/544; H01L 23/562; H01L 24/45; H01L 24/48; H01L 24/49; H01L 24/85; H01L 24/97; H01L 25/0753; H01L 25/167; H01L 2224/45124; H01L 2224/45139; H01L 2224/15144; H01L 2224/15147; H01L 2224/15169;
(Continued)

(56) References Cited

U.S. PATENT DOCUMENTS

2005/0133878 A1*  6/2005  Huang .............. H01L 27/14618
                                                          257/433
2008/0023721 A1    1/2008  Lee et al.
(Continued)

FOREIGN PATENT DOCUMENTS

JP    2002-223005 A    8/2002
JP    2008-512867 A    4/2008
(Continued)

*Primary Examiner* — Calvin Y Choi
(74) *Attorney, Agent, or Firm* — Squire Patton Boggs (US) LLP

(57) ABSTRACT

A light emitting device includes a plurality of light emitting elements and a package. The package includes two metal parts on which the plurality of light emitting elements are disposed, and a resin body securing the two metal parts. The resin body has four sides and four connecting parts alternately connected to one another in a top view. Two subsequent sides are perpendicular to each other. Each of the two metal parts includes a die-pad on which one or more of the plurality of light emitting elements are disposed, and two extending portions extending from the die-pad. An end portion of each of the two extending portions is extended laterally outward from a respective one of the connecting parts of the resin body, and the end portion of each of the two extending portions is located inward of virtual extension lines of corresponding two sides of the resin body.

22 Claims, 13 Drawing Sheets

(51) Int. Cl.
  *H01L 33/62* (2010.01)
  *H01L 25/16* (2006.01)
  *H01L 23/00* (2006.01)
  *H01L 33/48* (2010.01)
  *H01L 33/50* (2010.01)
  *H01L 33/56* (2010.01)
  *H01L 33/60* (2010.01)
  *H01L 23/544* (2006.01)
  *H01L 25/075* (2006.01)

(52) U.S. Cl.
  CPC .......... *H01L 24/97* (2013.01); *H01L 25/0753* (2013.01); *H01L 25/167* (2013.01); *H01L 33/486* (2013.01); *H01L 33/502* (2013.01); *H01L 33/56* (2013.01); *H01L 33/60* (2013.01); *H01L 24/45* (2013.01); *H01L 24/49* (2013.01); *H01L 24/85* (2013.01); *H01L 2224/45124* (2013.01); *H01L 2224/45139* (2013.01); *H01L 2224/45144* (2013.01); *H01L 2224/45147* (2013.01); *H01L 2224/45169* (2013.01); *H01L 2224/48137* (2013.01); *H01L 2224/48245* (2013.01); *H01L 2224/48257* (2013.01); *H01L 2924/1033* (2013.01); *H01L 2924/12035* (2013.01); *H01L 2924/12041* (2013.01); *H01L 2924/181* (2013.01); *H01L 2924/351* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(58) Field of Classification Search
  CPC . H01L 2224/48137; H01L 2224/48245; H01L 2224/48257; H01L 2924/1033; H01L 2924/12035; H01L 2924/12041; H01L 2924/181; H01L 2924/351; H01L 2933/0033; H01L 2933/0041; H01L 2933/005; H01L 2933/0058; H01L 2933/0066; H01L 23/12–15; H01L 23/49503–49513
  USPC .......................................................... 257/88
  See application file for complete search history.

(56) References Cited

U.S. PATENT DOCUMENTS

| | | |
|---|---|---|
| 2008/0303052 A1 | 12/2008 | Lee et al. |
| 2009/0242906 A1 | 10/2009 | Tsukagoshi |
| 2013/0221509 A1 | 8/2013 | Oda et al. |
| 2013/0256710 A1* | 10/2013 | Andrews ................. H01L 24/97 257/88 |
| 2015/0316700 A1* | 11/2015 | Oh ..................... G02B 19/0061 362/609 |
| 2016/0013378 A1 | 1/2016 | Sakamoto et al. |
| 2017/0004981 A1* | 1/2017 | Sakamoto ........... H01L 23/3737 |
| 2017/0092816 A1 | 3/2017 | Ikeda et al. |
| 2017/0133302 A1* | 5/2017 | Truhitte ................ H01L 21/561 |
| 2017/0288104 A1 | 10/2017 | Ukawa et al. |
| 2018/0097150 A1 | 4/2018 | Ikeda et al. |

FOREIGN PATENT DOCUMENTS

| | | |
|---|---|---|
| JP | 3142406 U | 6/2008 |
| JP | 2011-134902 A | 7/2011 |
| JP | 2013-058782 A | 3/2013 |
| JP | 2013-140892 A | 7/2013 |
| JP | 2013-225573 A | 10/2013 |
| JP | 2014-116575 A | 6/2014 |
| JP | 2014-150244 A | 8/2014 |
| JP | 2015-138797 A | 7/2015 |
| JP | 2016-021446 A | 2/2016 |
| JP | 2016-029732 A | 3/2016 |
| JP | 2016-106428 A | 6/2016 |
| JP | 2017-069539 A | 4/2017 |
| JP | 2017-183578 A | 10/2017 |

* cited by examiner

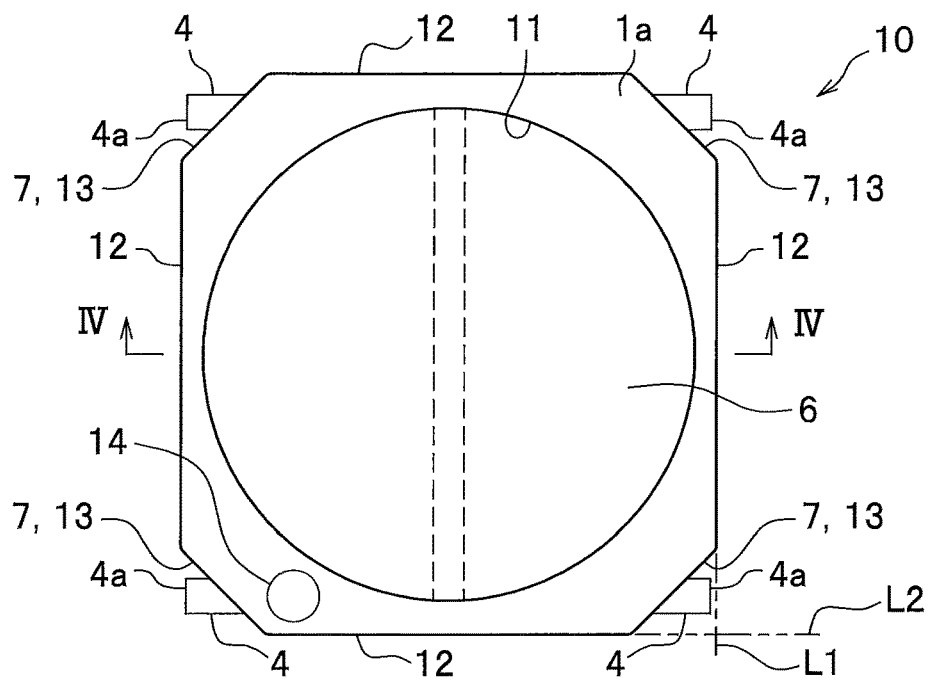
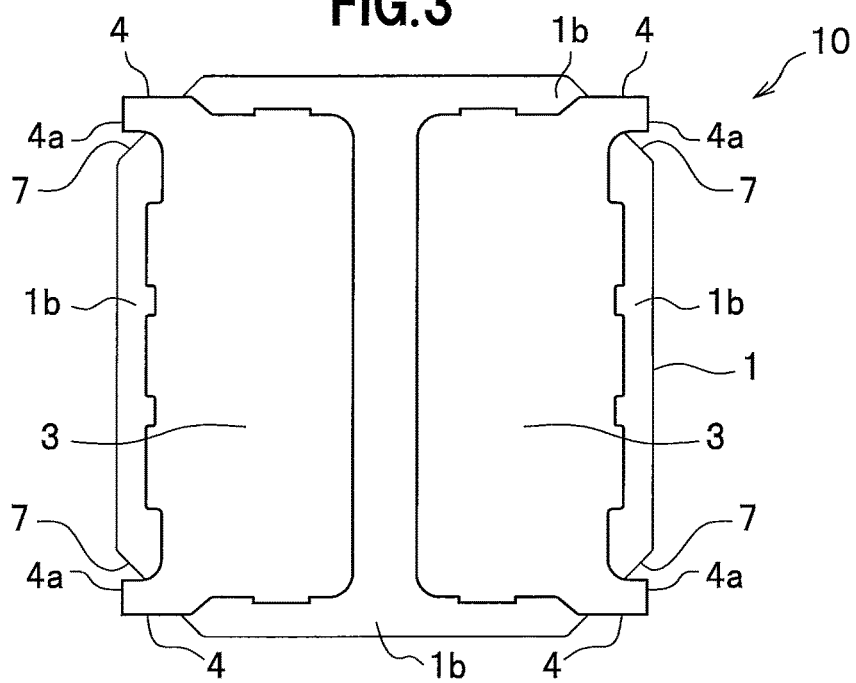
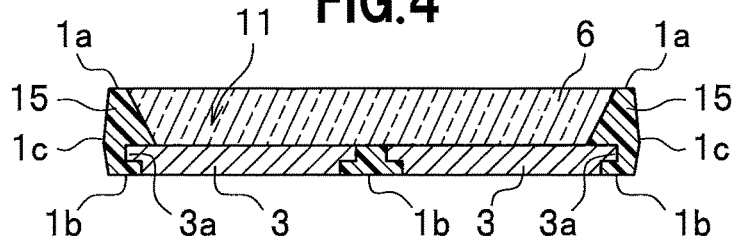

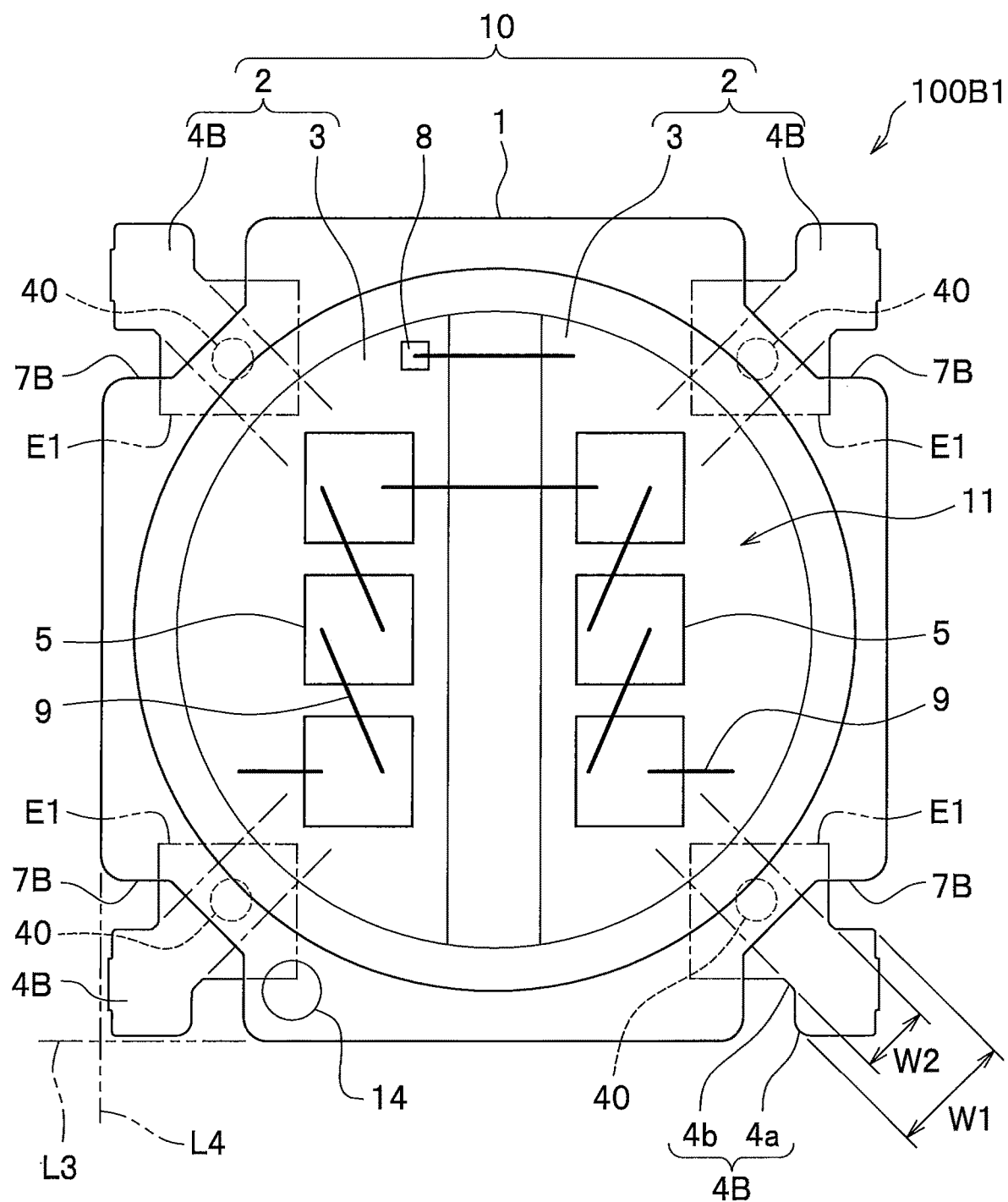

LIGHT EMITTING DEVICE AND METHOD OF MANUFACTURING THE LIGHT EMITTING DEVICE

CROSS-REFERENCE TO RELATED PATENT APPLICATIONS

This application claims priority to Japanese Patent Application No. 2018-036791 filed on Mar. 1, 2018, and Japanese Patent Application No. 2018-106395 filed on Jun. 1, 2018. The entire disclosures of Japanese Patent Application No. 2018-036791 and Japanese Patent Application No. 2018-106395 are hereby incorporated herein by reference.

BACKGROUND

The present disclosure relates to a light emitting device and a method of manufacturing the light emitting device.

A light emitting device including a package, which includes lead terminals and a resin body, and a light emitting element disposed in a recess of the package is known (for example, see Japanese Registered Utility Model No. 3142406). In the light emitting device in Japanese Registered Utility Model No. 3142406, the lead terminals are extended laterally outward from four corners of the package. The lengths of the lead terminals extended laterally outward from the package are such that, when manufacturing, a respective one of corresponding lead terminals of adjacent light emitting devices that face each other can be sufficiently connected to a single electrode.

SUMMARY

Employing a structure of the lead terminals extended laterally outward from the package may cause an increase in the external dimensions of the light emitting device.

According to certain embodiments of the present disclosure, a small light emitting device and a method of manufacturing the same can be provided.

A light emitting device according to one embodiment of the present invention includes: a plurality of light emitting elements; and a package comprising: two metal parts on which the plurality of light emitting elements are disposed, and a resin body securing the two metal parts, the resin body having four sides and four connecting parts alternately connected to one another in a top view, in which extensions of two subsequent sides are perpendicular to each other. Each of the two metal parts includes a die-pad on which one or more of the plurality of light emitting elements are disposed, and two extending portions extending from the die-pad. In a top view, an end portion of each of the two extending portions is extended laterally outward from a respective one of the connecting parts of the resin body. The end portion of each of the two extending portions is located inward of extension lines of corresponding two sides of the resin body.

A method of manufacturing a light emitting device according to another embodiment of the present invention includes: providing a lead frame including a metal frame, one or more pairs of die-pads and two extending portions respectively extending from each of the die-pads toward the metal frame; molding resin bodies each securing a respective pair of the one or more pairs of die-pads, each of the resin bodies has four sides and four connecting parts alternately connected to one another in a top view, in which extensions of two subsequent sides are perpendicular to each other; placing light emitting elements on the one or more pairs of die-pads; sealing the light emitting elements; and cutting the lead frame. In the molding resin bodies, the resin bodies are molded such that an end portion of each of the extending portions is protruded laterally outward from corresponding one of the connecting parts of each of the resin bodies. In the cutting the lead frame, cutting is performed at the one or more pairs of extending portions such that, in a top view, the end portions of each extending portion are located inward of extension lines of corresponding two sides of the resin body, without cutting the resin bodies.

According to certain embodiments of the present disclosure, a small-sized light emitting device can be provided.

BRIEF DESCRIPTION OF THE DRAWINGS

FIG. 2 is a schematic top view of a package of the light emitting device according to the first embodiment.

FIG. 3 is a schematic bottom view of the package of the light emitting device according to the first embodiment.

FIG. 4 is a schematic cross-sectional view of the package of the light emitting device according to the first embodiment, in a direction indicated by arrow IV-IV in FIG. 2.

FIG. 17D is a schematic bottom view showing through-holes each formed in a corresponding one of die-pads of another form at the back surface of the light emitting device according to the third embodiment.

DETAILED DESCRIPTION

Figure 1:
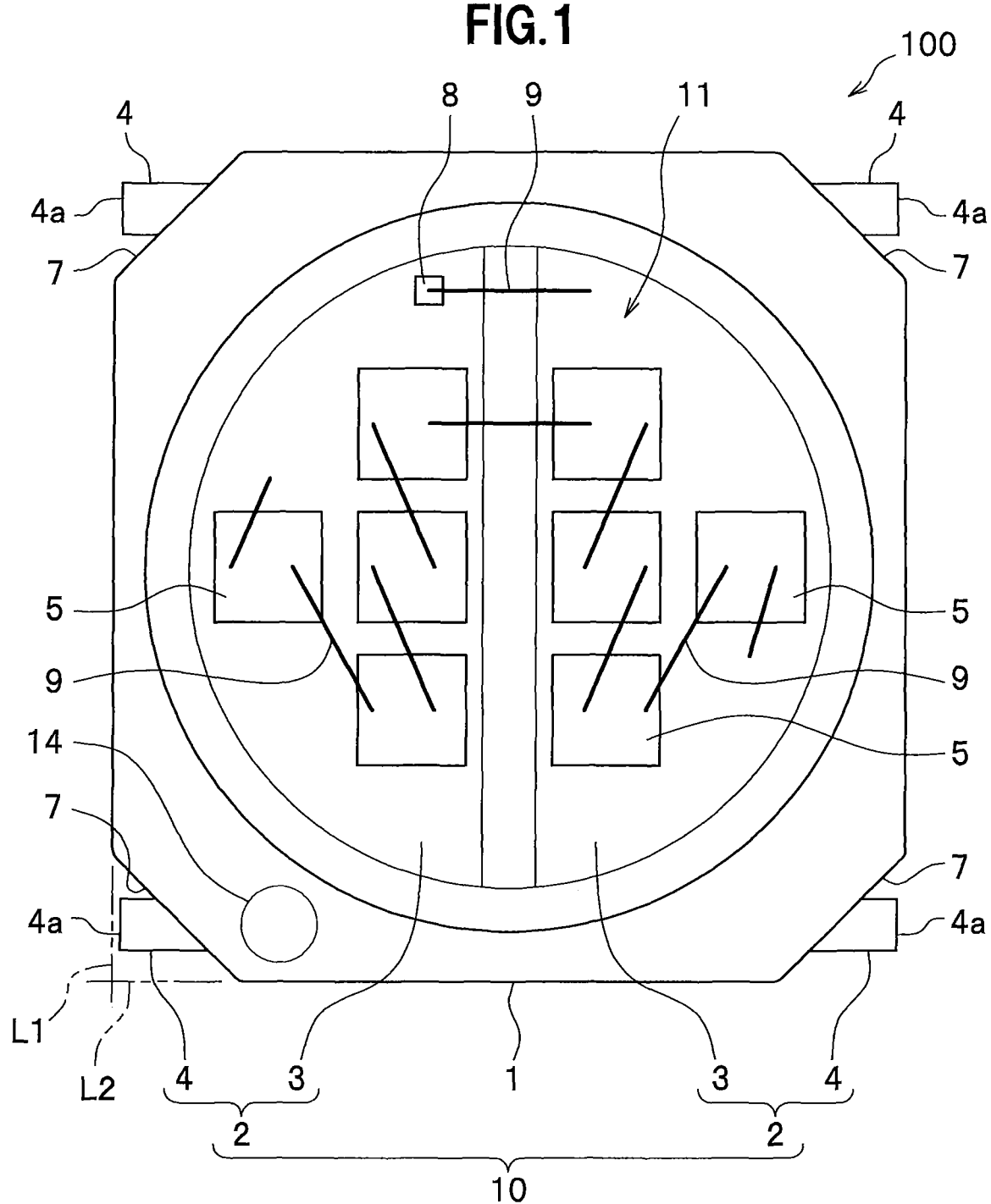
FIG. 1 is a diagram showing an overview of a light emitting device according to a first embodiment, and is a schematic top view of the light emitting device.

Light emitting devices according to certain embodiments and methods of manufacturing thereof will be illustrated below in detail. The drawings referred to in the description below are to schematically illustrate certain embodiments, and the size, a space, interval, locational relationship, and the like of the components may be exaggerated, or a portion of a component may not be shown. Also, the size and/or space or interval of components may not be the same between a plan view and its corresponding cross-sectional view. In the description below, the same designations or the same reference numerals denote the same or like members and duplicative descriptions thereof will be appropriately omitted. In the present specification, the terms such as "upper" and "lower" are used to illustrate a relative locational relationship between the components in a drawing, and unless specifically indicated, are not intended to show absolute positional relationship.

First Embodiment

Structure of Light Emitting Device

Embodiments will be described below with reference to the accompanying drawings. FIG. 1 is a diagram showing the overview of a light emitting device according to a first embodiment, and is a schematic top view of the light emitting device. FIG. 2 is a schematic top view of a package of the light emitting device according to the first embodiment. FIG. 3 is a schematic bottom view of the package of the light emitting device according to the first embodiment. FIG. 4 is a schematic cross-sectional view of the package of the light emitting device according to the first embodiment, in a direction indicated by arrow IV-IV in FIG. 2.

A light emitting device 100 includes a package 10 and a plurality of light emitting elements 5 disposed in the package. The package 10 includes a resin body 1 and two metal parts 2, and defines a recess 11 housing the light emitting elements 5 that have been mounted on a corresponding one of the metal parts 2. The resin body 1 is configured to secure the two metal parts 2. In a top view, the resin body 1 includes four sides inscribed in an imaginary rectangle, and four connecting parts 7 each being adjacent to respective two of the four sides. That is, in a top view, the resin body 1 has the four connecting parts 7 located alternately with the four sides, in which extensions of two subsequent sides of the four sides are perpendicular to each other. Each of the metal parts 2 includes a die-pad 3, on which one or more of the plurality of light emitting elements 5 are disposed, and two extending portions 4 extending from the die-pad 3. In a top view, an end portion 4a of each of the extending portions 4 is protruded laterally outward from a respective one of the connecting parts 7 of the resin body 1. In a top view, the end portion 4a of each of the extending portions 4 is located inward of respective extension lines L1 and L2, respectively extending from subsequent sides of the resin body 1 and adjacent to the respective one of the connecting parts 7 of the resin body 1.

In a top view, in the light emitting device 100, the extending portions 4 to serve as leads are located inward of a quadrangle inscribing the periphery of the resin body 1. Accordingly, outer dimensions of the light emitting device 100 can be reduced.

Further, when a plurality of the light emitting devices 100 are arranged in a matrix, long sides of the resin bodies 1 of the light emitting devices 100 can be closely arranged with each other. That is, in a top view, the plurality of light emitting devices 100 can be arranged without a need of excessive spacing from one another.

Furthermore, in a conventional light emitting device in which lead terminals are extended laterally outward from a package, outer dimensions of the light emitting device may vary depending on the accuracy of cutting the leads in singulation. On the other hand, the outer dimensions of the light emitting device 100 according to the first embodiment can be precisely obtained according to the accuracy of molding of the resin body 1, so that reliability of the light emitting device 100 can also be enhanced.

Structure of Resin Body 1

The resin body 1 has an upper surface and a bottom surface, and one or more outer lateral surfaces and one or more inner lateral surfaces, and an upward-facing surface surrounded by the one or more inner lateral surfaces. In certain embodiments, the one or more inner lateral surfaces and a portion of the upward-facing surface of the resin body 1, and parts of the die pads define the recess. In other words, each of the resin bodies 1 has a wall portion 15.

In a top view, the resin body 1 has a substantially octagonal outer peripheral shape. The substantially octagonal outer peripheral shape of the resin body 1 has four long sides 12 and four inclined short sides 13 which are four connecting parts 7. The inclined short sides 13 are shorter than the long sides 12, and are inclined with respect to adjacent long sides 12. Although the short sides are illustrated in the figures with respective inclination angles of 45°, any appropriate inclination angles can be employed. The connecting parts 7 of the resin body 1 corresponds to the inclined short sides 13 in a top view. The end 4a of each of the extending portions 4 is protruded laterally outward from a respective one of the inclined short sides 13, which are the connecting parts 7.

An embossed carrier tape is generally used to transport light emitting devices. A common embossed carrier tape has recessed housings each having a square or rectangular shape in a top view and recessed in a cross-sectional view, and each light emitting device is housed in a respective one of the housing portions. If each of the light emitting devices has a squire or a rectangular shape in a top view, a contact area between the lateral surfaces defining the recessed housing and the lateral surfaces of the light emitting device is relatively large. On the other hand, when each of the light emitting devices has an octagonal shape in a top view, a contact area between the lateral surfaces defining the recessed housing and the lateral surfaces of the light emitting device is small. When such light emitting devices having an octagonal outer peripheral shape are transported in an embossed carrier tape, the light emitting devices may not be held still and may be turned, tilted, or otherwise, due to vibration or the like during transportation. Although the resin body 1 of each of the light emitting device 100 has an octagonal outer peripheral shape in a top view, the end portion 4a of each of the extending portions 4 is protruded from a respective one of the inclined short sides 13 allowing for an overall outer peripheral shape equivalent to a rectangular shape. Accordingly, occurrence of variation in positioning such as turning, tilting, or otherwise of the light emitting devices during transportation can be reduced.

In a top view, each of the resin bodies 1 preferably has a circular inner peripheral shape surrounding the plurality of light emitting elements 5. That is, in a top view of each of the packages 10, a periphery surrounding the recess 11 preferably has a circular shape. Accordingly, the light emitting device 100 can have a light-emission surface of a circular shape. Further, the one or more inner lateral surfaces of each of the resin bodies 1 are provided widening upward from the upward-facing surface 1b toward the upper surface of the resin body 1.

Also, when each of the resin bodies 1 has a circular inner peripheral shape in a top view, a radial thickness that is a radial distance between the external periphery and the inner periphery (hereinafter may be referred to as a "thickness of the wall portion 15") of each of the resin body 1 can be more uniform with an octagonal outer peripheral shape than with a square or a rectangular outer peripheral shape. The more uniform the thickness of the wall portion 15, the more uniform thermal expansion or thermal contraction will be, allowing for more uniform distribution of thermal stress.

As shown in FIG. 4, the one or more outer lateral surfaces 1c of each of the resin bodies 1 are formed continuous to the upper surface 1a of the resin body 1 and to the lower surface 1b of the resin body 1. A portion of the resin body 1 exposed at a central region of the upward-facing surface of the recess 11 serves as an insulating portion separating the two die-pads 3 respectively serve as a positive electrode or a negative electrode.

The resin body 1 is provided with a mark 14 indicating a polarity at a location corresponding to either one of the two die-pads 3. The mark 14 is a cathode mark or an anode mark. The mark 14 is preferably formed on the upper surface 1a of the resin body 1.

The resin body 1 is configured to secure the two metal parts 2 and to provide the wall portion 15. The resin body 1 is formed such that the wall portion 15 and the portion between the die-pads 3 are continuous with each other. Examples of a resin material of the resin body 1 include a thermoplastic resin and a thermosetting resin.

Examples of the thermoplastic resin include polyphthalamide resin, liquid crystal polymer, polybutylene terephthalate (PBT), unsaturated polyester, or the like.

Examples of the thermosetting resin include epoxy resin, modified epoxy resin, silicone resin, modified silicone resin, urethane resin, acrylate resin, or the like.

In order to efficiently reflect light at the inner lateral surface of the wall portion 15, a light-reflective material may be contained in the resin material of the resin body 1. For example, titanium oxide, zinc oxide, zirconium oxide, aluminum oxide, silicon oxide, glass filler, silica, magnesium oxide, antimony oxide, aluminum hydroxide, barium sulfate, magnesium carbonate, and barium carbonate are relatively stable against moisture or the like, and have high refractive indices and high thermal conductivity, and thus are preferable.

Structure of Metal Part 2

For a material of the metal part 2, for example, copper, iron, aluminum, or an alloy containing one or more of these is preferably used. Further, plating is applied on a surface of the metal part 2 exposed at an upward-facing surface of the recess 11, such that reflectance to light emitted from the light emitting element 5 can be increased. Examples of the materials of the plating include gold, silver, nickel, palladium, or aluminum, which may be applied in a single layer or a plurality of layers. Further, it is preferable to apply plating also on a surface of the metal part 2 exposed at a lower surface of the package 10. This allows for increasing the bonding strength with a conductive member such as a solder.

The two die-pads 3 are preferably symmetrical to each other in a top view. With such die-pads 3 symmetrical to each other, symmetrical electrodes can be provided on a back surface of the light emitting device 100, allowing more precise alignment of the light emitting device 100 than by using asymmetric dis-pads 3, when mounting (i.e., secondary mounting) the light emitting device(s) on an external mounting substrate, by using for example a solder. As used herein, the expression "symmetrical to each other" includes shapes that are approximately symmetrical to each other with partial modification. With such a partial modification, the two die-pads 3 can be distinguished from each other while allowing more precise alignment.

As shown in FIG. 3, back surfaces of the two die-pads 3 are exposed at the lower surface of the package 10. As shown in FIG. 3, with the two die-pads 3 arranged symmetrically on the lower surface of the package 10, more uniform heat dissipation from the right and from the left can be obtained, allowing for an improvement in the heat dissipation balance. Further, with good heat dissipation performance of the light emitting devices 100, a large number of the light emitting elements 5 can be disposed in the light emitting device 100 to increase output.

The same number of the light emitting elements 5 are preferably arranged on each of the die-pads 3. In the first embodiment, four light emitting elements 5 are arranged on each of the die-pads 3, which allows for obtaining a high-output power light emitting device. Although illustrated as above, any appropriate number of the light emitting elements 5 can be arranged. Further, it is preferable that the light emitting elements 5 on the die-pads 3 are also symmetrically arranged. With this arrangement, for example, when manufacturing an outdoor lighting device, a lens for use in combination with the light emitting device 100 can be designed more easily than in the case in which the light emitting elements 5 are non-symmetrically arranged.

Each of the die-pads 3 may have a plate shape with a uniform thickness, but may alternatively have a projection 3a that projects laterally as shown in FIG. 4. The projection 3a extends continuously or intermittently at a periphery of each of the die-pads 3. The projection 3a is a peripheral portion of each die-pad 3 with a thickness smaller than a thickness of a central portion of a respective die-pad 3. With the projection 3a, adhesion between the die-pads 3 and the resin body 1 can be improved.

The die-pads 3 constitutes a portion of the upward-facing surface of the recess 11. The two die-pads 3 are spaced apart from each other to serve as a positive and a negative pair.

Each of the pair of die-pads 3 respectively corresponds to an anode electrode or a cathode electrode, having different polarities. Each of the die-pads 3 includes the two extending portions 4 each exposed extending from a respective one of the two connecting parts 7 of the resin body 1 that are adjacent to one long side, which is one of the four sides inscribed in an imaginary rectangle, along which the die-pad 3 is disposed.

Each of the extending portions 4 may have an end surface parallel to a corresponding one of the long sides 12 of the resin body 1 in a top view.

In the first embodiment, each of the extending portions 4 extends outward from a corresponding one of the die-pads 3, in an arrangement direction of the two die pads 3, along a corresponding one of the long sides 12 of the resin body 1. A direction perpendicular to the extending direction of each of the extending portions 4 is also along another corresponding long side 12 of the resin body 1.

As shown in FIG. 2, the end portion 4a of each of the extending portions 4 is located in a region surrounded by an imaginal extension line L1 of a corresponding one of the long sides 12 of the resin body 1, an imaginal extension line L2 of another one of long sides 12, and the resin body 1.

The extending portions 4 are located at corner portions of the light emitting device 100 in a top view, which allows for enhancing strength of corner portions of the resin body 1. Further, in the light emitting device 100, in a top view, the extending portions 4 are extended laterally outward from the resin body 1. With this arrangement, when the light emitting device 100 is mounted (secondary-mounted) on an external mounting substrate by using, for example, a solder, a state of a fillet of the solder can be observed at the extending portions 4.

Structure of Light Emitting Element 5

The light emitting elements 5 are arranged on respective die-pads 3 at the upward-facing surface of the recess 11 of the package 10. A p-electrode of each of the light emitting elements 5 is electrically connected to a cathode-side die-pad 3 or an n-electrode of another one of the light emitting elements 5 via a corresponding one of wires 9. An n-electrode of each of the light emitting elements 5 is electrically connected to an anode-side die-pad 3 or a p-electrode of another one of the light emitting elements 5 via a corresponding one of the wires 9.

The light emitting elements 5 used herein may have any appropriate shapes or dimensions. The light emitting elements 5 may have an emission color with any appropriate wavelength according to the intended use. For example, for a blue light (i.e., light with a wavelength in a range of 430 nm to 490 nm) emitting element, a GaN-based semiconductor can be used. For the GaN-based semiconductor, $In_XAl_YGa_{1-X-Y}N$ ($0 \leq X \leq 1$, $0 \leq Y \leq 1$, $X+Y<1$) or the like can be used. For the light emitting elements 5, a light emitting element including negative and positive electrodes (i.e., p- and n-electrodes) at the same surface side thereof can be used, or a light emitting element having an opposite electrode structure, in which positive and negative electrodes are respectively disposed on opposite surfaces of the light emitting element, can be used.

Other Components

The light emitting device 100 further includes a sealing member 6, a protective element 8, and the wires 9.

The sealing member 6 covers the light emitting elements 5 and other component(s) mounted in the recess 11 of the package 10. The sealing member 6 is provided for protecting the light emitting elements 5 other component(s) from an external force, dust, moisture and the like, and to improve the heat resistance, weather resistance, and light-fastness of the light emitting element 5 and the like.

For the sealing member 6, a light-transmissive resin material, for example, a silicone resin material, an epoxy resin material, or a urea resin material can be used.

In addition to such a material, a fluorescent material, a filler material having a high light reflectance may be added to the sealing member 6.

Mixing, for example, a fluorescent material into the resin material of the sealing member 6 can facilitate adjusting a color of the emission of the light emitting device 100. For the filler material contained in the resin material of the sealing member 6, for example, a substance having high light reflectance, such as $SiO_2$, $TiO_2$, $Al_2O_3$, $ZrO_2$, or MgO can be preferably used. Further, for the purpose of reducing light of undesired wavelengths, for example, an inorganic or organic coloring dye or coloring pigment may be used.

For the protective element 8, for example, a Zener diode can be used. The Zener diode can be disposed spaced apart from the light emitting elements 5 on a corresponding one of the die-pads 3. More specifically, the Zener diode is preferably disposed on a corresponding one of the die-pads 3 at a position near the insulating portion separating the two die-pads 3, and also near the lateral surface defining the recess 11.

The wires 9 are electrically conductive wires each for electrically connecting a corresponding one of the light emitting elements 5 or an electrical component such as a protective element to a corresponding one of the die-pads 3. For a material of the wires 9, a metal such as Au (gold), Ag (silver), Cu (copper), Pt (platinum), Al (aluminum), or alloy of one or more of these is preferably used. The wires 9 of an appropriate diameter can be used according to the purpose and the intended use.

Method of Manufacturing Light Emitting Device

Figure 5:
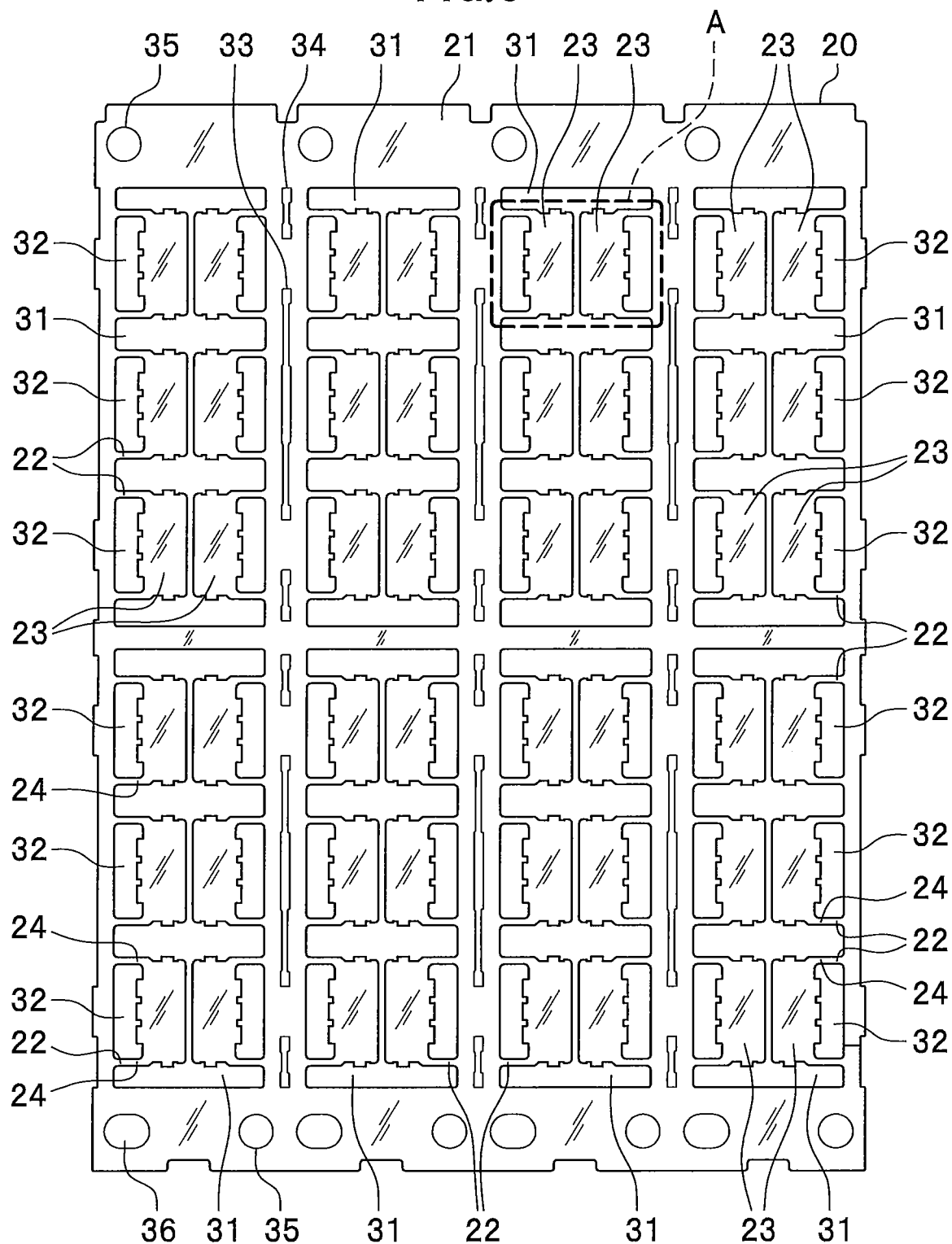
FIG. 5 is a diagram showing an overview of a method of manufacturing the light emitting device according to the first embodiment, and is a schematic top view of a lead frame.
Figure 6:
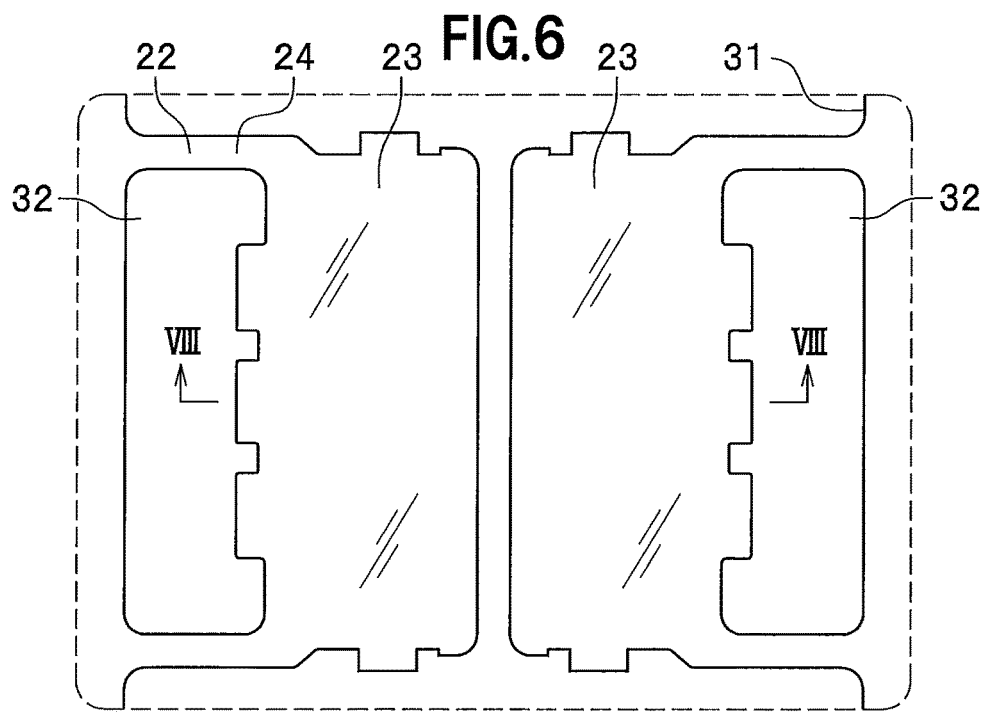
FIG. 6 is a schematic top view of the lead frame, and is a partially enlarged view of FIG. 5.
Figure 7:
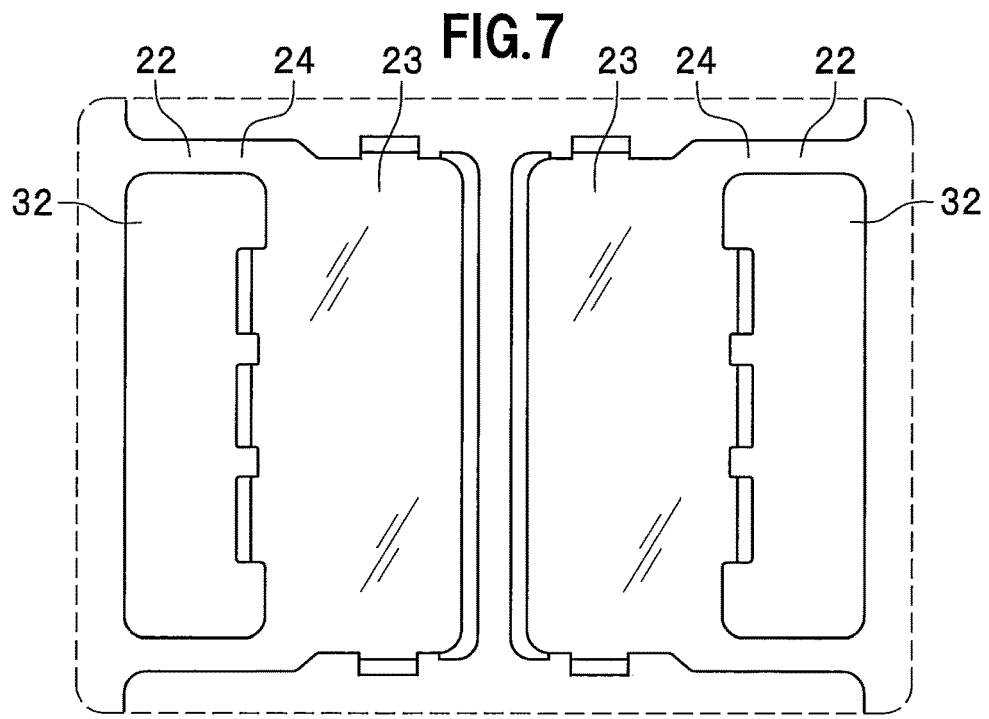
FIG. 7 is a schematic bottom view of the lead frame, and is a partially enlarged view of FIG. 5.
Figure 8:
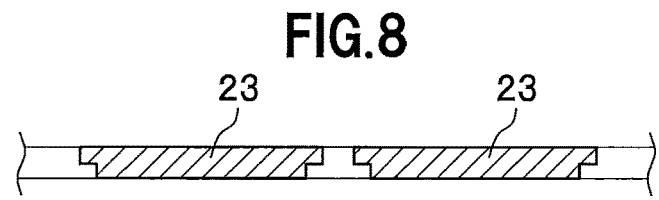
FIG. 8 is a schematic cross-sectional view of the lead frame, in a direction of arrow VIII-VIII in FIG. 5.
Figure 9:
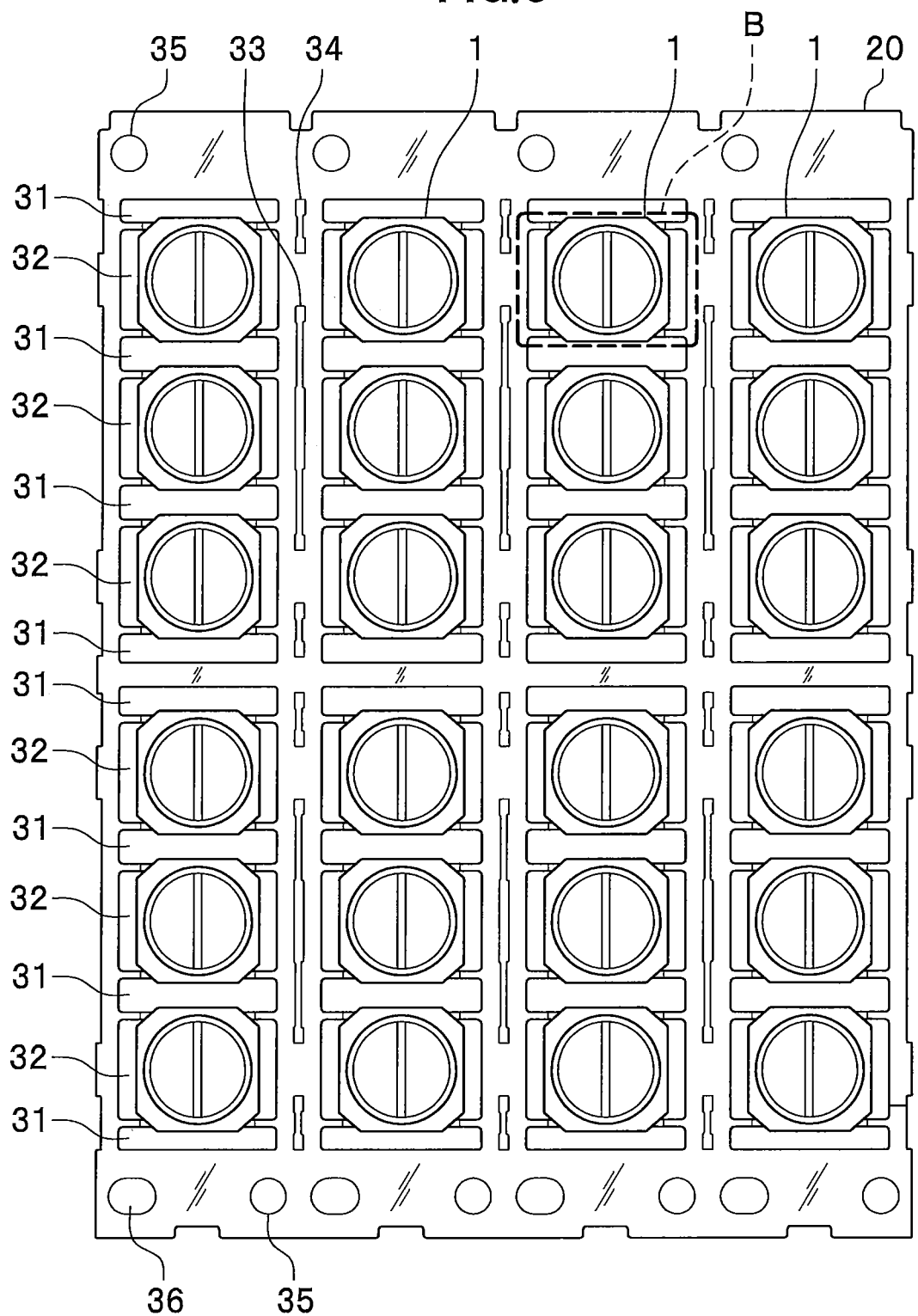
FIG. 9 is a diagram showing an overview of the method of manufacturing the light emitting device according to the first embodiment, and is a schematic top view of the lead frame after forming resin bodies.
Figure 10:
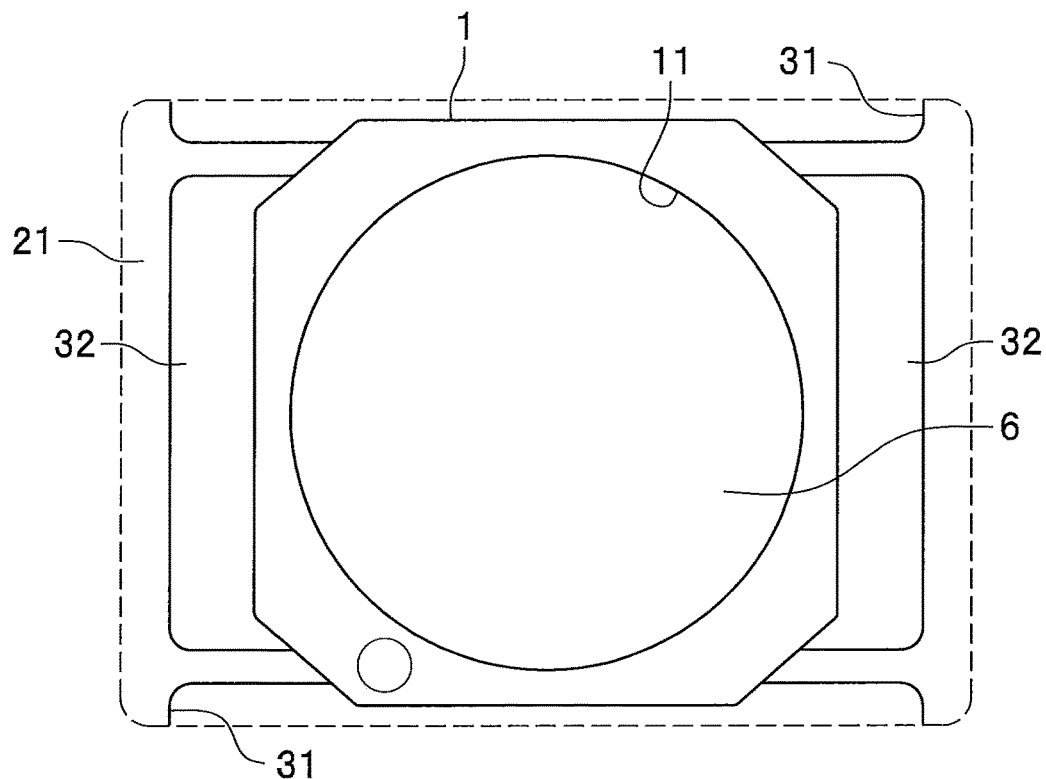
FIG. 10 is a diagram showing an overview of the method of manufacturing the light emitting device according to the first embodiment, and is a schematic partial enlarged view of the lead frame after sealing light emitting elements by a sealing resin.
Figure 11:
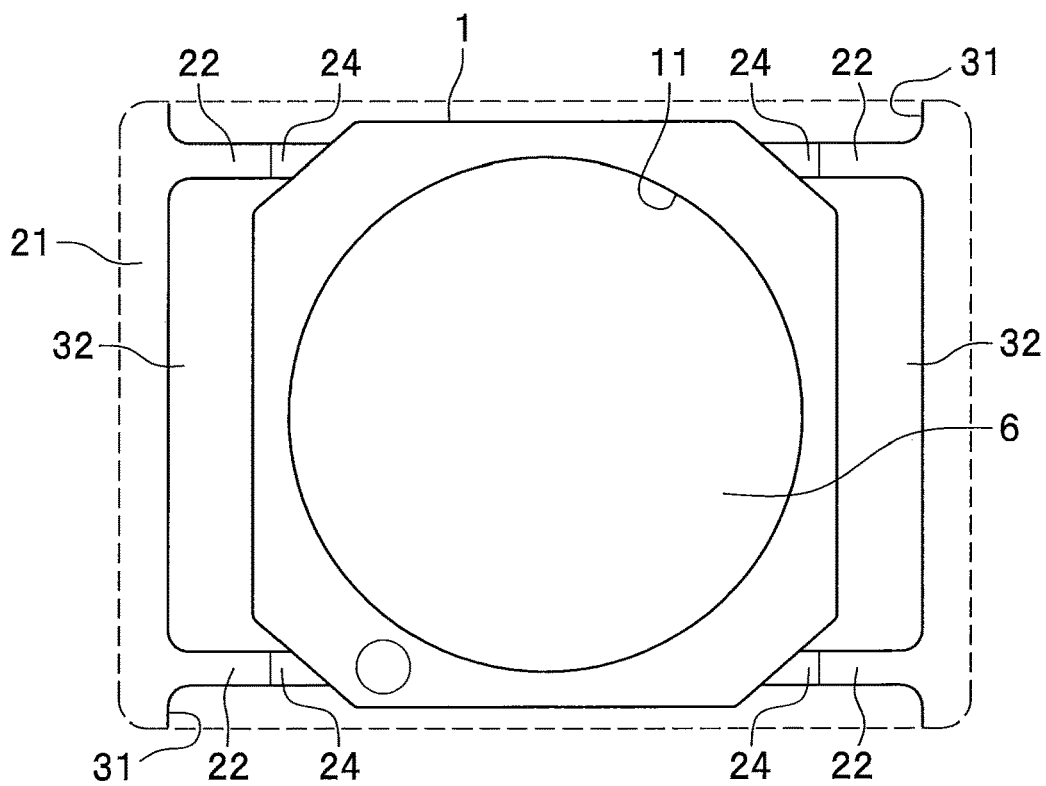
FIG. 11 is a diagram showing an overview of the method of manufacturing the light emitting device according to the first embodiment, and is a schematic partial enlarged view of the lead frame with predetermined cutting lines.

FIG. 5 is a diagram showing an overview of a method of manufacturing the light emitting device according to the first embodiment, being a schematic top view of a lead frame. FIG. 6 is a schematic top view of the lead frame, and is a partially enlarged view of FIG. 5. FIG. 7 is a schematic bottom view of the lead frame, and is a partially enlarged view of FIG. 5. FIG. 8 is a schematic cross-sectional view of the lead frame, taken along the direction of arrows VIII-VIII in FIG. 5. FIG. 9 is a diagram showing an overview of the method of manufacturing the light emitting device according to the first embodiment, and is a schematic top view of the lead frame after forming a resin body. FIG. 10 is a diagram showing an overview of the method of manufacturing the light emitting device according to the first embodiment, and is a schematic partial enlarged view of the lead frame after sealing light emitting elements by a sealing resin. FIG. 11 is a diagram showing an overview of the method of manufacturing the light emitting device according to the first embodiment, and is a schematic partial enlarged view of the lead frame with predetermined cutting lines. FIG. 6 and FIG. 7 are partially enlarged views of a region indicated by A in FIG. 5. FIG. 10 and a FIG. 11 are partially enlarged views of a region indicated by B in FIG. 9.

The method of manufacturing the light emitting device according to the first embodiment includes providing, molding, placing light emitting elements, sealing, and cutting.

In the step of providing, a lead frame 20 is provided. The lead frame 20 is obtained by performing punching, etching, and/or the like on a flat metal plate.

The lead frame 20 shown in FIG. 5 to FIG. 8 includes a metal frame 21, suspension leads 22, one or more pairs of die-pads 23, and one or more pairs of extending portions 24.

Each pair of the one or more pairs of extending portions 24 extend from a respective die-pad 23 of the one or more pairs of die-pads 23. An expression "die-pad 23 of the lead frame 23" refers to a portion of the lead frame 23 corresponding to a respective one of the die-pads 3 after obtaining the light emitting device, and refers to a state before singulation. Each pair of die-pads 23 are symmetrical to each other in a top view. An expression "extending portions 24 of the lead frame 23" refers to portions of the lead frame 23 each corresponding to a respective one of the extending portions 4 after obtaining the light emitting device, and refers to a state before singulation.

In the lead frame 20, light emitting device portions respectively corresponding to the light emitting devices are arranged in a matrix, and a plurality of through-slits 31 are defined. Each of the plurality of through-slits 31 is formed with a shape to separate corresponding light emitting portions (for example, three light emitting device portions as shown in FIG. 5 and FIG. 9) arranged in a column direction (longitudinal direction), in row directions (lateral directions). Portions of each through-slit 31 are used to dispose an insulating portion such that lead portions corresponding to a respective one of the light emitting devices can serve as the positive and negative electrodes of the light emitting device after singulation.

The lead frame 20 is further formed with a plurality of through-holes 32 aligned in row directions. The through-holes 32 are formed to demarcate the light emitting device regions, and in certain embodiments, are formed at right and left sides of each of the light emitting device portions. The through-slits 31 and the through-holes 32 are not to be completely filled with a resin, but partially filled with the resin. Further, as shown in FIG. 6 and FIG. 7, and also shown as projection portions 3a in FIG. 4, projections may be formed at periphery of each die-pad 23, projecting inward of the through-slit 31 and the through-hole 32 adjacent to the die-pad 23.

Further, through-holes 33 to 35, to which the resin is not to be applied, are formed in appropriate locations of the metal frame 21 of the lead frame 20. The through-holes 33 to 35 are formed for the purpose of alignment, reduction in weight, etc., with a shape appropriate for a purpose thereof.

Such through-holes and projections can be formed by etching, pressing, and/or the like. The through-holes and the projections can be formed, for example, by applying etching to an upper surface and to a lower surface of the lead frame 20, under a condition for processing approximately a half of a thickness of the lead frame 20. The through-holes can be formed by applying etching to both the upper surface and the lower surface of the lead frame 20, and the projections can be formed by applying etching to either the upper surface or lower surface of the lead frame 20. Such etching can be performed using different mask patterns for the upper surface and the lower surface of the lead frame 20. Further, because etching produces curved surfaces, it easily allows for forming of protrusions formed with curved surfaces, but any appropriate processing can be selected according to purpose and use.

In the step of molding, as shown in FIG. 9, resin bodies 1 are molded to secure each pair of die-pads 23. The resin bodies 1 are formed by, for example, holding the lead frame 20 between an upper mold and a lower mold, and transfer-molding a resin.

In the step of molding, the resin bodies 1 are molded using molds that allows each resin body 1 has an outer peripheral shape of, e.g., an octagon, and an inner peripheral shape of, e.g., a circle in a top view.

In a top view, each of the resin bodies 1 is formed to have four connecting parts 7 each connected to two adjacent sides extensions of which are perpendicular to each other. In the step of molding, the resin bodies 1 are formed so that an end portion 4a of each of the extending portions 24 is protruded laterally outward from a respective one of the connecting parts 7 of each of the resin bodies 1.

Plating treatment of the metal part 2 may be performed before or after formation of the resin bodies 1. Performing a plating treatment in the lead frame 20 before formation of the resin bodies 1 allows for simplifying the method of manufacturing, and thus is preferable. In the case of performing a plating treatment after formation of the resin bodies 1, because a state of a surface of the lead frame 20 is rougher before the plating treatment, forming the resin bodies 1 before the plating treatment allows for increasing adhesion between the lead frame 20 and the resin bodies 1.

In the step of placing the light emitting elements, one or more light emitting elements 5 are placed on the each of die-pads 23. A plurality of light emitting elements 5 is preferably placed on each of the die-pads 23. In the first embodiment, the same number of the light emitting elements 5 are arranged on each of the die-pads 23. This allows for obtaining good heat dissipation balance.

Bonding members, each bonding a respective one of the light emitting elements 5 and a corresponding one of the die-pads 23, are formed on an upper surface of the respective one of the die-pads 23 by applying. A protective element 8 may be disposed on a predetermined portion of a corresponding one of each pair of the die-pads 23. Each of the light emitting elements 5 is electrically connected to an adjacent one of the light emitting elements 5 via a wire 9. Further, each of predetermined electronic components such as the light emitting elements 5 is electrically connected to a corresponding one of the die-pads 3.

In the step of sealing, the light emitting elements 5 are sealed. For example, a resin coating apparatus applies a resin forming the sealing member 6 onto the plurality of light emitting elements 5. Then, the applied resin is cured. For example, a thermosetting resin can be used for the resin. Further, at least one of a fluorescent material, an inorganic filler, and an organic filler may be contained in the resin. The sealing member 6 may be formed so as to have a flat surface, to charge the minimum-required amount of the resin. The expression "flat surface" includes a concave shape formed due to sink of the resin. In the case where the sealing member 6 functions as a lens, a height of an upper surface of the sealing member may be gradually increased to form a concave-lens shape.

In the step of cutting, the lead frame 20 is cut without cutting the resin bodies 1.

In the step of cutting, the extending portions 24 are cut from the metal frame 21 so that the end portion 4a of each of the extending portions 24 is located in a region surrounded by a respective one of the connecting parts 7 and the extension lines L1 and L2 adjacent to the respective one of the connecting parts 7 in a top view. Cutting is preferably performed such that a cutting blade is perpendicularly brought into contact with the extending portions 24. Bringing the cutting blade into contact at an angle approximate to the right angle allows for reducing misalignment at the time of cutting. Further, cutting not in an inclined direction but in a perpendicular direction allows for reducing a width of a cut surface, so that accuracy in cutting can be increased. A cutting direction is not parallel to any one of the inclined short sides 13 of each resin body 1, which has an octagonal shape. In FIG. 11, each of predetermined cutting lines is shown as a boundary between a respective one of the extending portions 24 and a respective one of the suspension leads 22. Each of the predetermined cutting lines is parallel to a corresponding one of the long sides of the resin body 1. By performing cutting along the predetermined cutting lines, the light emitting device 100 shown in FIG. 1 can be obtained.

Each extending portion 24 is located at a respective one of four corner portions of a respective one of the light emitting device portions of the lead frame 20. In the step of cutting, the suspension leads 22 are cut in a single direction and at equivalent locations relative to the respective resin bodies to obtain the four extending portions 24 for each of the light emitting devices. Thus, the extending portions 24 have cut surfaces in parallel to the single direction. This allows for reducing stress experienced on each of the light emitting devices when cutting the extending portions 24 from the metal frame, compared to the case in which the extending portions 24 are formed by cutting from the metal frame 21 in two directions.

Further, the lead frame 20 includes four extending portions 24 located at four corner portions of a respective one of the light emitting device portions, which allows for dispersing stress that may cause a crack in the molded resin at the time of singulating the light emitting devices, compared to a lead frame in which two extending portions are respectively located at two opposite sides of each light emitting device portion. That is, in the step of cutting, compared to the case of cutting two end portion of each of leads at two opposite sides of each light emitting device portion to be cut off from a metal frame, which is an outer frame, performing cutting at an end portion of each of the leads at four corners of each light emitting device portion allows for reducing stress applied on each cut portion, so that breakage in a molded resin can be prevented.

Further, after the formation of the resin bodies 1, as shown in FIG. 9, with the plurality of light emitting device portions that has been separated for each row by the slits 31, singulation can be achieved by cutting the lead frame only in the column direction, so that number of manufacturing steps can be reduced.

Variant Example of First Embodiment

Figure 12:
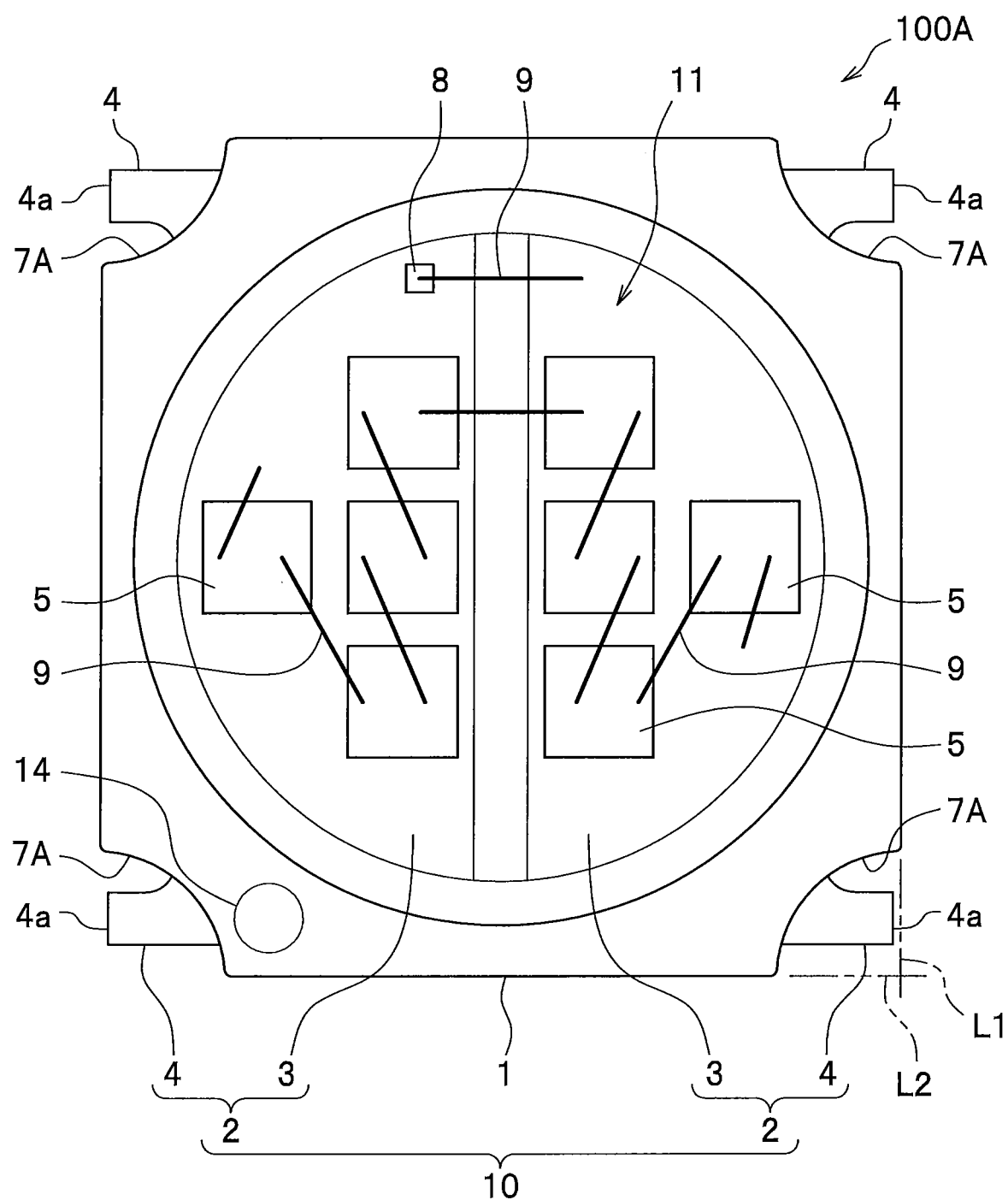
FIG. 12 is a diagram showing an overview of a light emitting device according to a variant example of the first embodiment, and is a schematic top view of the light emitting device.

FIG. 12 is a diagram showing the overview of a light emitting device according to a variant example of the first embodiment, and is a schematic top view of the light emitting device. A light emitting device 100A is different from the light emitting device 100 according to the first embodiment in an outer peripheral shape of the resin body 1 in a top view. In the description below, the same reference numerals will be applied to the components that have the same structure as those in the light emitting device 100 according to the first embodiment, and description thereof will be appropriately omitted.

In a top view, an outer peripheral shape of a resin body 1 has four long sides 12 opposite to one another and four circular arcs, which are four connection portions 7A. Each of the circular arcs, being the four connecting parts 7A, is continuous to two corresponding long sides 12, extensions of which are perpendicular to each other, of the four long sides 12. The circular arcs, being the four connecting parts 7A, passes inside of an octagon, with both ends of each of the four long sides 12 being apexes of the octagon. An end portion 4a of each of extending portions 4 is protruded laterally outward from a respective one of circular arcs that are the four connecting parts 7A. Also in the light emitting device 100A, in a top view, the extending portions 4, being portions of leads, are located inward of a region surrounded by extending lines L1 and L2 of the long sides 12 of the resin body 1. Accordingly, outer dimensions of the light emitting device 100A can be reduced.

A method of manufacturing the light emitting device 100A according to a variant example of the first embodiment is similar to the method of manufacturing the light emitting device 100 according to the first embodiment. Meanwhile, molds used in molding in the method of manufacturing the light emitting device 100A are different from those in the method of manufacturing the light emitting device 100. In the molding in the method of manufacturing the light emitting device 100A, molds that allows the resin body 1 to have an outer periphery of an octagonal shape with four inclined sides that are four circular arcs recessed inwardly and an inner periphery of, e.g., a circular shape, in a top view, are used to perform the molding.

Second Embodiment

Structure of Light Emitting Device

Figure 13:
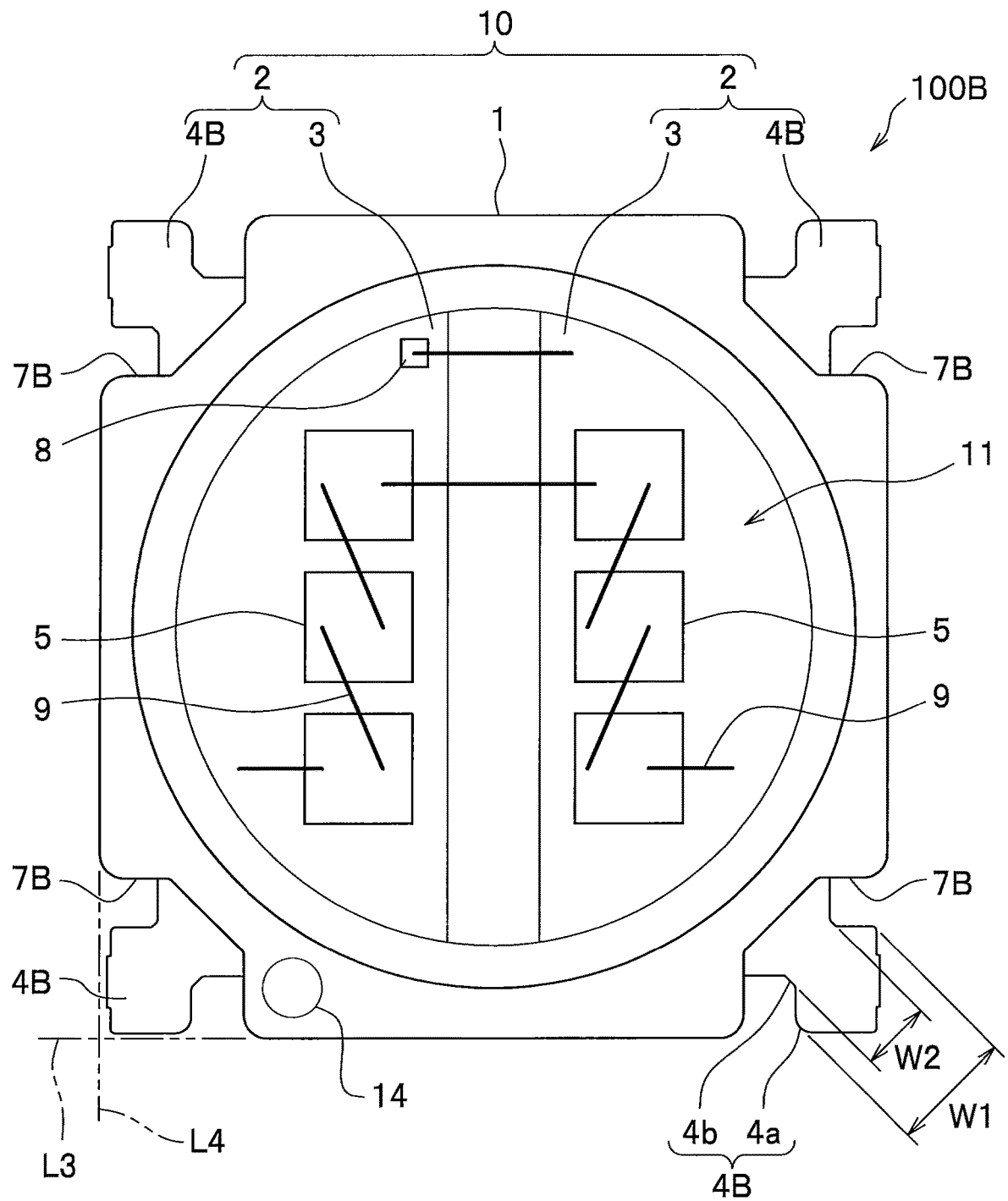
FIG. 13 is a diagram showing an overview of a light emitting device according to a second embodiment, and is a schematic top view of the light emitting device.

FIG. 13 is a diagram showing the overview of the light emitting device according to the second embodiment, being a top view of the light emitting device. A light emitting device 100B is different from the light emitting device 100 according to the first embodiment in an outer peripheral shape of the resin body 1 and a shape of extending portions 4B. Further, in the second embodiment, three light emitting elements 5 are arranged on each of die-pads 3. In the description below, the same reference numerals will be applied to the components that have the same structure as those in the light emitting device 100 according to the first embodiment, and description thereof will be appropriately omitted.

In the light emitting device 100B, in a top view, an outer peripheral shape of the resin body 1 includes four long sides 12 that are two pairs of opposite sides and four polygonal lines that are four connection portions 7. Each of the four polygonal lines is formed by three straight segments and is continuous to two long sides 12 extensions of which are perpendicular to each other. An end portion 4a of each of extending portions 4B is protruded laterally outward from the polygonal line of a respective one of the connecting parts 7B.

As shown in FIG. 13, in a top view, the end portion 4a of each of the extending portions 4B is located in a region surrounded by a respective one of the connecting parts 7B and imaginal extension lines L3 and L4, respectively extending from a long side adjacent to the connecting part 7B. Also in the light emitting device 100B, in a top view, the extending portions 4B that serve as the leads are located inward of the rectangle inscribing the resin body 1. Accordingly, outer dimensions of the light emitting device 100B can be reduced.

In the light emitting device 100B, in a top view, each of the extending portions 4B has a width W1 of the end portion 4a greater than a width W2 of its base-end part 4b. Thus, for example, when the light emitting device 100B is bonded to a mounting substrate, the extending portions 4B can be easily pressed, so that operation can be facilitated.

Method of Manufacturing Light Emitting Device

Figure 14:
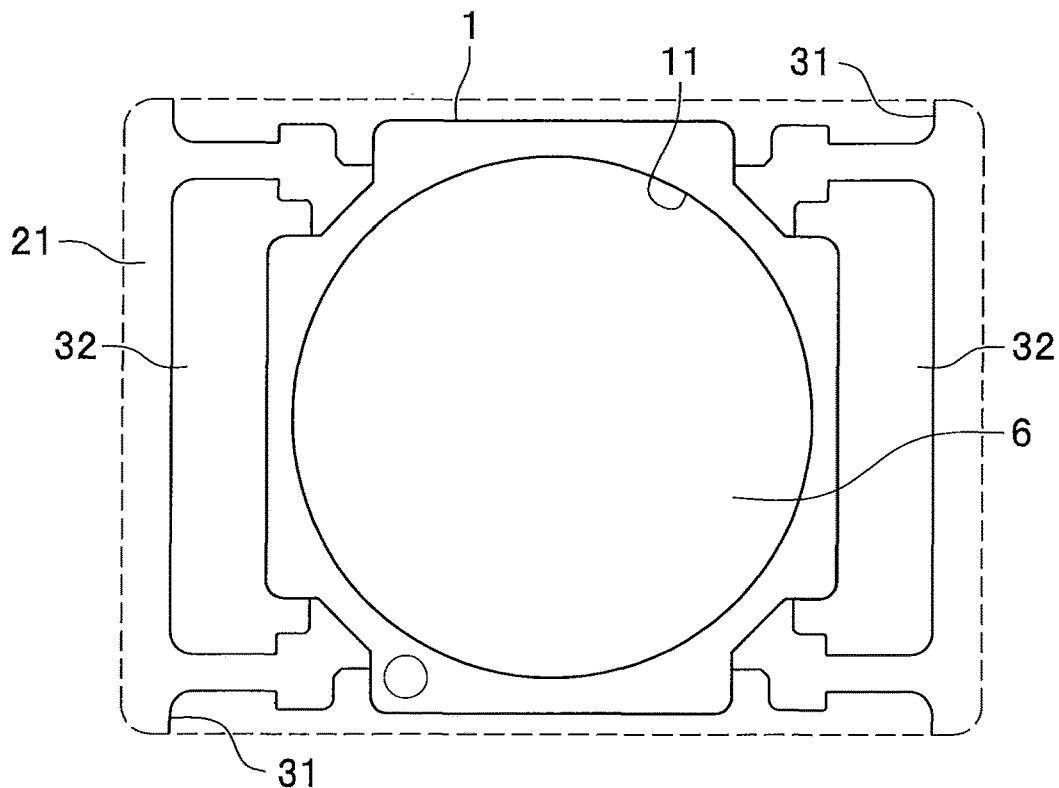
FIG. 14 is a diagram showing an overview of the method of manufacturing the light emitting device according to the second embodiment, and is a schematic partial enlarged view of the lead frame after sealing a light emitting element by a sealing resin.
Figure 15:
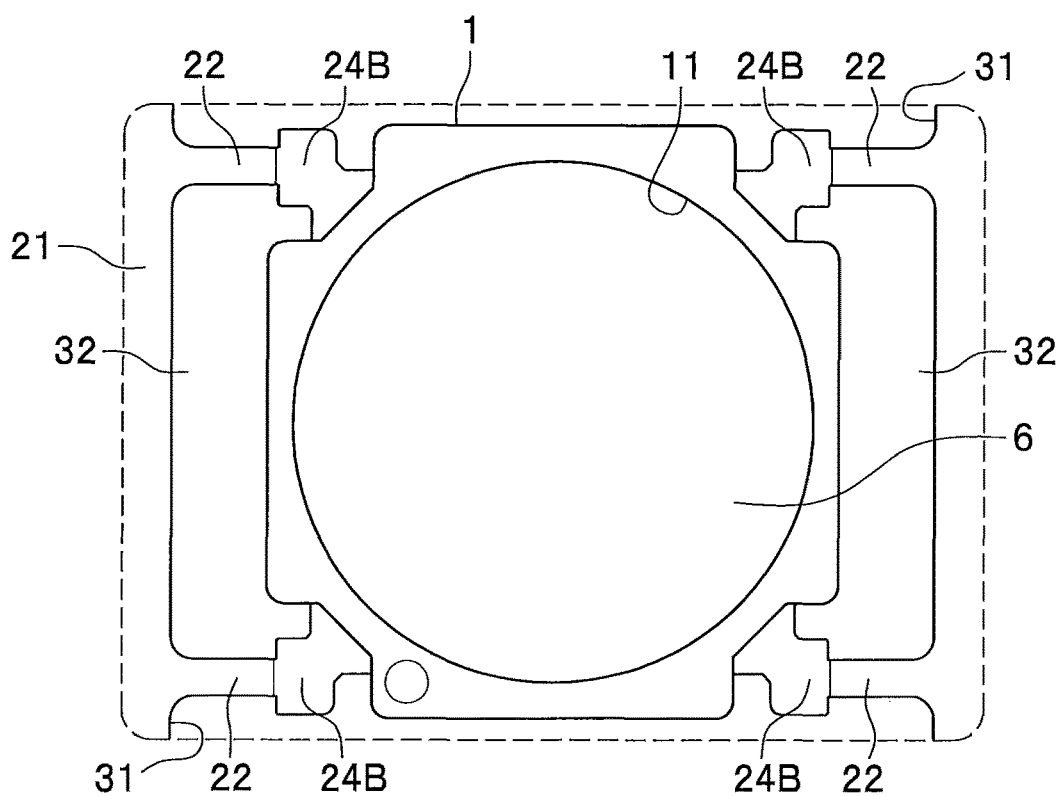
FIG. 15 is a diagram showing an overview of the method of manufacturing the light emitting device according to the second embodiment, and is a schematic partial enlarged view of the lead frame with predetermined cutting lines.

FIG. 14 is a diagram illustrating an overview of the method of manufacturing the light emitting device according to the second embodiment, and is a schematic partial enlarged view of a lead frame after sealing the light emitting elements by a sealing resin. FIG. 15 is a diagram illustrating an overview of the method of manufacturing the light emitting device according to the second embodiment, and is a schematic partial enlarged view of the lead frame with predetermined cutting lines.

A method of manufacturing the light emitting device 100B according to of the second embodiment is similar to the method of manufacturing the light emitting device 100 according to the first embodiment. Meanwhile, a shape of a lead frame 200 to be provided, and molds used in molding in the method of manufacturing the light emitting device 100B are different from those in the method of manufacturing the light emitting device 100. Each of the molds has a shape such that, in a top view, each of the resin body 1 molded by the mold has an outer periphery of an octagonal shape with four inclined sides each being inwardly recessed polygonal lines, and an inner periphery of, e.g., a circular shape.

Each of FIG. 14 and FIG. 15 is a schematic partial enlarged view of one example of the lead frame 200 to be provided. As can be understood from a comparison between FIG. 14 and FIG. 15, in a step of cutting, cutting is performed along predetermined cutting lines, each of which is shown as a boundary between a respective one of the extending portions 24B and a respective one of the suspension leads 22, as shown in FIG. 15. Thus, the light emitting device 100B shown in FIG. 13 can be obtained.

Each extending portion 24B is located at a respective one of four corner portions of a respective one of the light emitting device portions of the lead frame 20. In the step of cutting, boundaries between the four extending portions 24B and respective suspension leads 22 are cut in a single direction and at equivalent locations relative to the respective resin bodies. Thus, each of the extending portions 24B has a single cut surface. This allows for reducing stress applied to the extending portions 24B compared to the case of cutting the extending portions 24B in two directions to cut off a metal frame.

Further, each of the extending portions 24B has an area larger than that of each of the extending portions 24 in FIG. 1 in a top view, so that, for example during manufacturing, the lead frame 200 can be more easily placed between molds while holding the extending portions 24B. Thus, holding the extending portions 24B by a jig allows for releasing a molded resin from the molds. This allows for preventing formation of a recess that is a trace of a pin for releasing the molded resin from the molds, so that the light emitting device 100B with good appearance can be obtained. In addition, a mark 14 is not required to be conspicuous, which allows the mark 14 to be formed with a smaller depth, so that strength of the resin body 1 can be increased.

Certain embodiments for carrying out the present invention are described above in detail, but the scope of the present invention is not limited to the description above and should be broadly interpreted on the basis of the claims. Further, based on the description above, it will be obvious that various changes and modifications can be made therein without departing from the scope of the invention.

The method of manufacturing the light emitting device may further include housing a light emitting device, which is obtained by the cutting of the lead frame, into an embossed carrier tape. The step of housing can be performed, for example, before or after inspecting the light emitting device. Alternatively, the step of housing can be performed before mounting the light emitting device to an external mounting substrate (i.e., secondary mounting) using, for example, a solder. In this step of secondary mounting, for example, using an automatic insertion device, the light emitting device is taken out from an embossed carrier tape and the light emitting device is secondary-mounted on, for example, the mounting substrate. For example, when octagonal light emitting devices are transported using a common embossed carrier tape, variations in positioning, such as turning, tilting, or otherwise of the light emitting devices may occur due to vibration or the like during transportation. When such light emitting devices being varied in terms of position are taken out using, for example, an automatic insertion device and secondary-mounted on a mounting substrate, a wiring pattern on a lower surface of each of the light emitting devices and a wiring pattern on an upper surface of the mounting substrate will not be connected at respective predetermined positions. This leads to failure in supplying electricity to the light emitting devices.

On the other hand, in the light emitting devices 100, 100A, and 100B, in a top view, an end portion of each of the extending portions is protruded laterally outward from a corresponding one of the connecting parts 7, 7A, and 7B, respectively, so that occurrence of variations in positioning of the light emitting devices 100, 100A, or 100B accommodated in the embossed carrier tape during transportation of the embossed carrier tape can be prevented.

Third Embodiment

Structure of Light Emitting Device

Figure 16A:
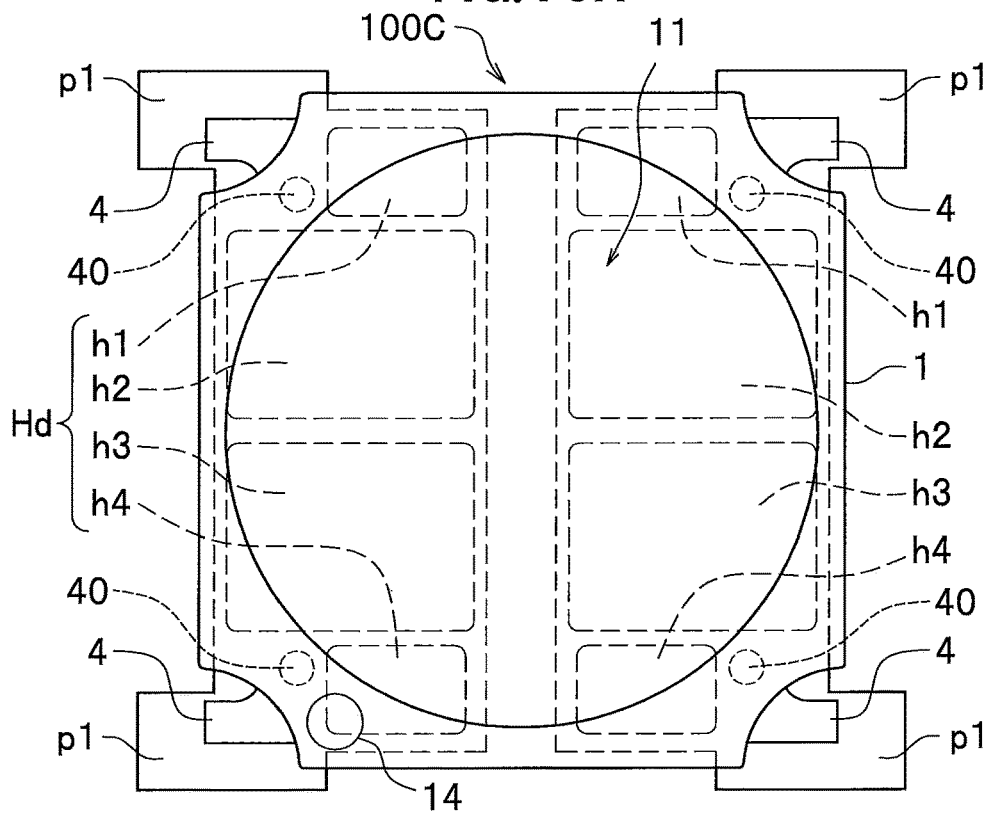
FIG. 16A is a schematic plan view showing a positional relationship between a light emitting device according to the third embodiment and a wiring pattern to be connected thereto.
Figure 16B:
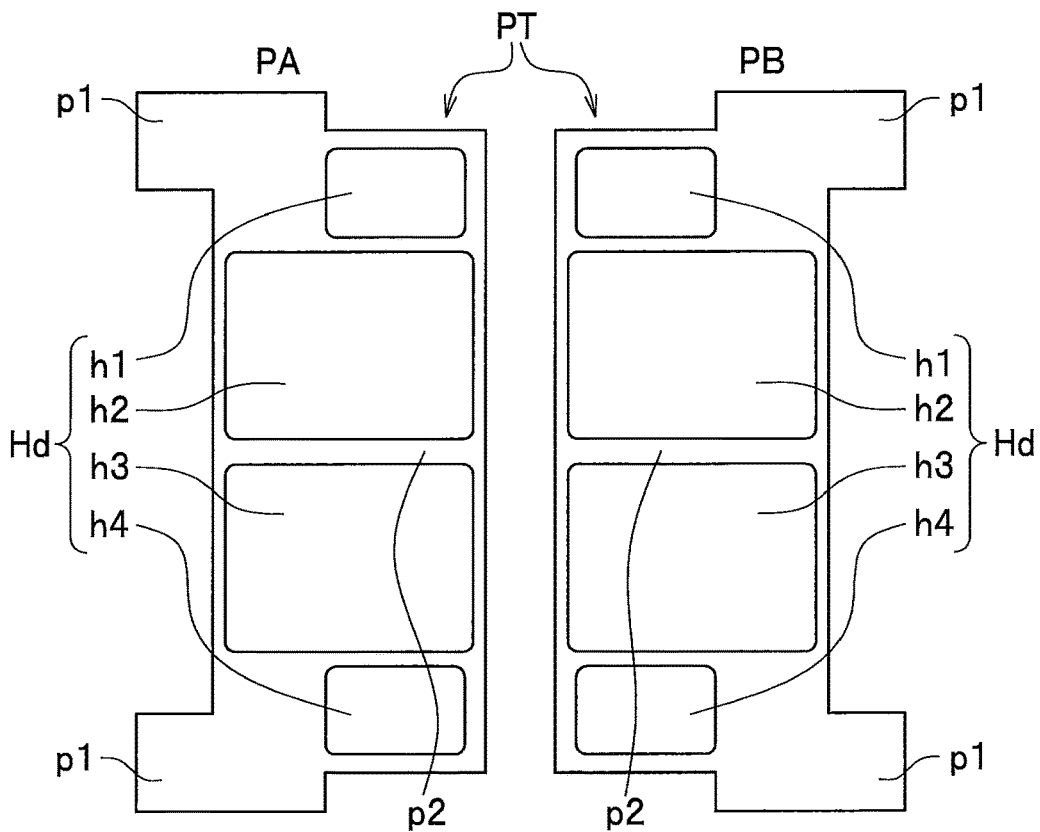
FIG. 16B is a schematic plan view showing an example of a wiring pattern to which the light emitting device according to the third embodiment is to be connected.
Figure 16C:
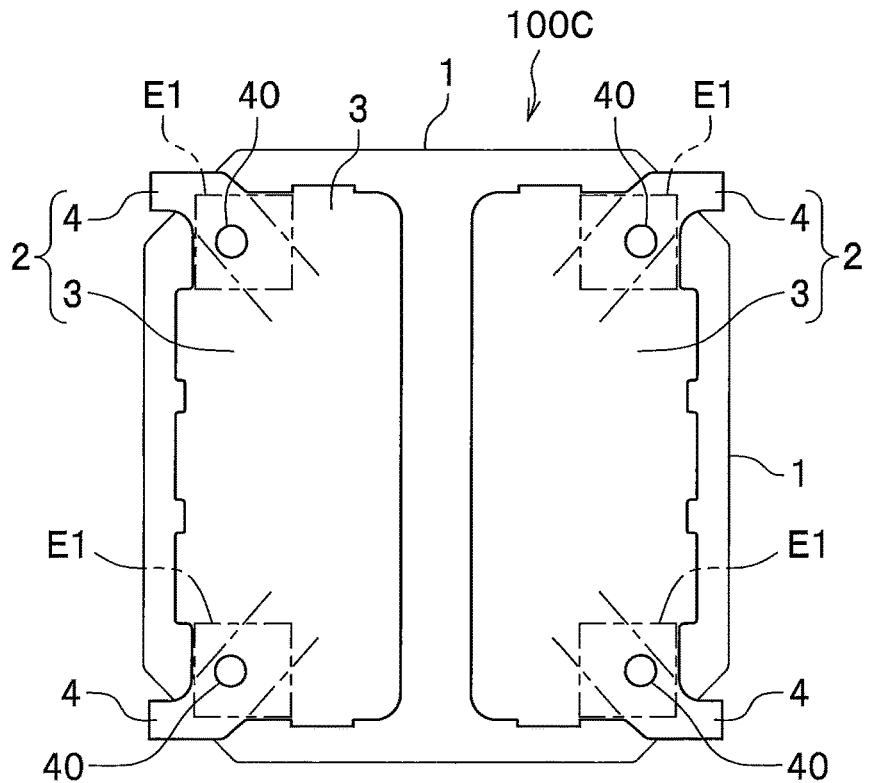
FIG. 16C is a schematic bottom view showing through-holes each formed in a corresponding one of die-pads at a back surface of the light emitting device according to the third embodiment.

Each of FIGS. 16A to 16C is a diagram illustrating structure of a light emitting device 100C according to a third embodiment. In the description below, the same reference numerals will be applied to the structure of the light emitting devices that has been described above, and description thereof may be appropriately omitted. The third embodiment is different from other embodiments in that through-holes or through-grooves are defined in predetermined portions of each die-pad. Accordingly, in the description below, shapes and locations of through-holes or through-grooves formed in each of die-pads of the light emitting device 100C will be illustrated, with other components that are the same as those in the first embodiment.

The light emitting device 100C includes a package 10 (see FIG. 1), and a plurality of light emitting elements 5 in the package 10 (see FIG. 1). The package 10 includes a resin body 1 and two metal parts 2, and defines a recess 11 (see FIG. 1) housing the light emitting elements 5 such that each of the light emitting elements 5 is mounted on a corresponding one of the metal parts 2. The resin body 1 is configured to secure the two metal parts 2. Each of the metal parts 2 includes a die-pad 3 on which one or more of the light emitting elements 5 (see FIG. 1) are disposed, two extending portions 4 extending from the die-pad 3. The die-pad 3 defines through-holes 40 that extend in a thickness direction of the die-pad 3 in a respective one of regions E1, which are adjacent to the base-end portion of a respective one of the extending portions 4, of the die-pad 3.

When the light emitting device 100C is disposed on a wiring pattern PT via, e.g., solders Hd, which are bonding members, the through-holes 40 serve to prevent misalignment of the light emitting device 100C. The through-holes 40 are filled with a resin of the resin body 1 so that a metal plate surface of the die-pad 3 and a surface of the resin are substantially in the same plane. Each of the through-holes 40 is formed in a die pad 3 at a predetermined region adjacent to a base-end portion of a corresponding one of the extending portions 4, which is, a substantially rectangular region E1 in the figures. Each of the regions E is designed to have an area approximately four times as large as an area of the corresponding extending portion 4, and is adjacent to the base-end portion of the corresponding extending portion 4. With the through-holes 40 formed in the respective regions of the die pads 3 adjacent to the base-end portions of the extending portions 4, and filled with the resin, when the solder Hd is unevenly applied on the die pads 3 of the light emitting device 100C, migration of the solder at the time of reflow can be interrupted by the resin filled in the through holes 40, so that misalignment of the light emitting device 100C can be reduced or prevented. As shown in FIG. 16A and FIG. 16B, the solder Hd is applied, for example, on four portions of each of the die-pads 3 such that amounts of the solder Hd applied at center portions h2 and h3 are greater than that of peripheral portions h1 and h4.

During reflow, the solder Hd wet-spreads and migrates along the metal surface of the die pad 3 and the extending portions 4.

If the solder Hd has been unevenly applied, during the reflow, the light emitting device 100C may be pulled by a portion of the wet-spreading solder Hb that is applied with a greater amount than other portions, which may result in misalignment of the light emitting device 100C from its predetermined position.

In view of this, the through-holes 40 are respectively formed in the substantially rectangular regions E1 each adjacent to the base-end portion of the corresponding extending portions 4 of each of the die-pads 3, and are filled with the resin of the resin body 1, such that the solders Hd do not wet-spread on the resin portions. Accordingly, during reflow, at least a portion or an entire of wet-spreading of the solder Hd toward the extending portions 4 can be interrupted or blocked by the resin filled in the through-holes 40, so that the light emitting device 100C can be bonded at a predetermined position.

That is, during reflow, the solder Hd wet-spreads toward the solder parts h1 and h2 or the solder parts h3 and h4 tends to move along a metal surface of the die-pad 3 and the corresponding one of the extending portions 4 toward a corresponding one of the extending portions 4 by reflow. However, with the resin member exposed from the metal surface through the through-holes 40 on a path where the solder parts h1 and h2 or the solder parts h3 and h4 wet-spread toward a corresponding one of the extending portions 4, flow of the solder parts h1 and h2 or the solder parts h3 and h4 will be at least partially hindered. With the solders Hd each applied such that an amount of the solder parts h1 and h2 and an amount of the solder parts h3 and h4 are substantially equal, the light emitting device 100C can be bonded at a predetermined position by reflow, whether or not the through-holes 40 are formed. Also, even if the amount of the solder Hd at the solder parts h1 and h2 and at the solder parts h3 and h4 are different to some extent, wet-spread of at least a portion of the solder Hd can be interrupted or blocked by the resin exposed from the metal surface through the through-holes 40, so that misalignment of the light emitting device 100C during reflow can be reduced or prevented.

Thus, with the through-holes 40 formed at locations adjacent to the base-end portion of the corresponding extending portions 4 of the die-pads 3 and on a path of wet-spreading solder Hd toward the extending portions 4, the wet-spread of the solder Hd can be hindered. The through-holes 40 each formed in a respective one of the regions E1, each of which is adjacent to the base-end portion of a respective one of the extending portions 4 and has an area four times as large as an area of the respective one of the extending portions 4, of each die-pad 3 can exhibit an effect as described above.

The through-holes 40 are more preferably formed such that each of the through-holes 40 is partially or entirely located inward of two imaginary straight lines (hereinafter may be referred to as "width-lines") that are in parallel to a diagonal line of the resin body 1, each connecting respective points defining a width of one extending portion 4 and a width of another diagonally located extending portion 4.

With the through-holes 40 each located inward of the width-lines described above, each through-hole 40 is located to face the base-end portion of respective extending portion 4. This arrangement allows for more reliably reducing misalignment of the light emitting device 100C due to wet-spreading of the solder Hd. Further, with this arrangement, locations of the through-holes 40 can be more inward with respect to the outer periphery of the corresponding die-pads 3, so that strength of the die-pads 3 can be easily maintained. It is more preferable that when the light emitting device 100C is temporary secured before reflow, the through-holes 40 are located such that at least a portion of the through-holes 40 do not overlap with the solder Hd applied on the wiring pattern PT.

Figure 17A:
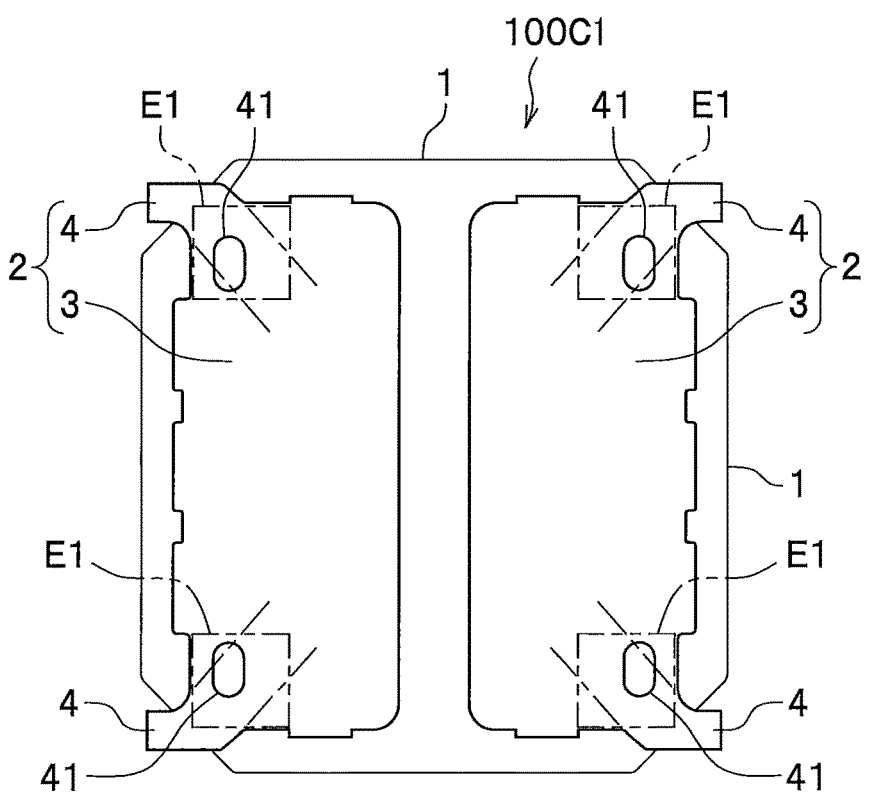
FIG. 17A is a schematic bottom view showing through-holes of another form each formed in a corresponding one of the die-pads at the back surface of the light emitting device according to the third embodiment.
Figure 17B:
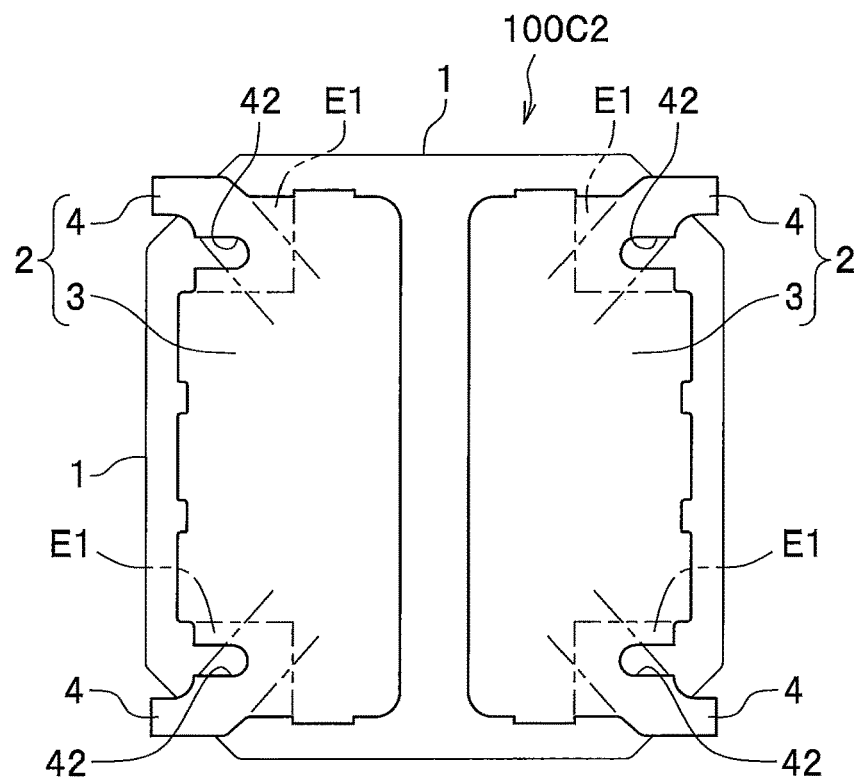
FIG. 17B is a schematic bottom view showing through-grooves each formed in a corresponding one of the die-pads at the back surface of the light emitting device according to the third embodiment.
Figure 17C:
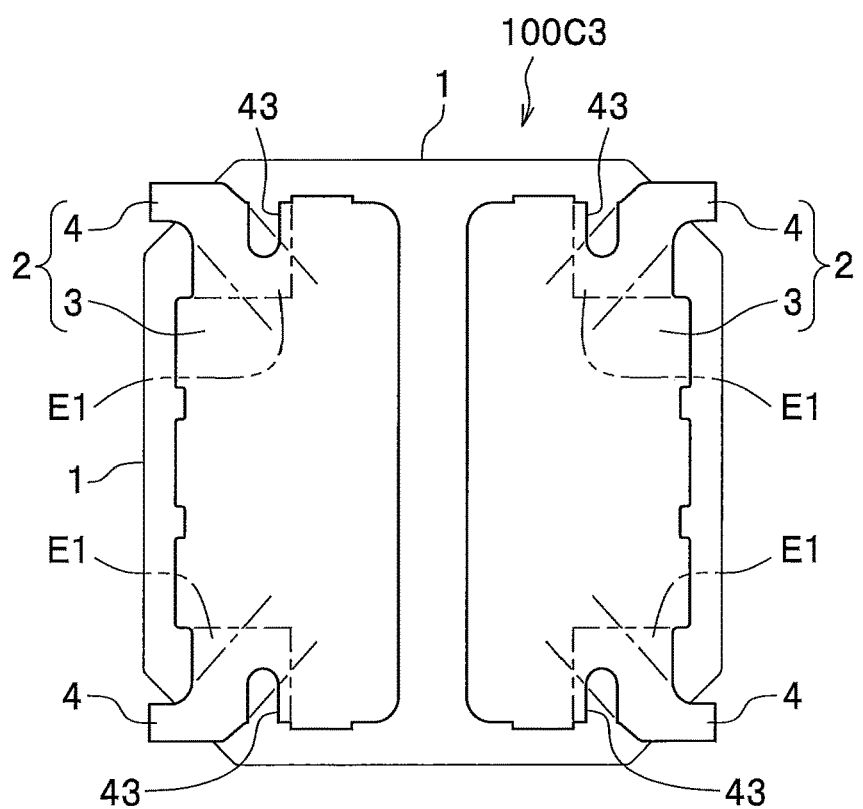
FIG. 17C is a schematic bottom view showing through-holes of another form each formed in a corresponding one of the die-pads at the back surface of the light emitting device according to the third embodiment.

Further, as shown in FIG. 16A and FIG. 16C, in a plan view, a shape of opening of each through-hole 40 may be circular or another appropriate shape. For example, as shown in FIG. 17A, each of the through-holes 41 may have an elliptic shape or an elongated circular shape. Such an elongated shape increases the area of the through hole such that wet-spreading of at least a portion of the solder Hd can be easily reduced. Alternatively, as shown in FIG. 17B and FIG. 17C, through-grooves 42 or through-grooves 43 may be formed. The resin of the resin body 1 is also applied into the through-grooves 42 or the through-grooves 43 to be coplanar with the metal surface of each of the die-pads 3. The through-grooves 42 or the through-grooves 43 are more preferably formed such that at least a portion of each of the through-holes grooves 42 or each of the through-grooves 43 is located overlap with a region between two imaginary straight lines (hereinafter may be referred to as "width-lines") that are in parallel to a diagonal line of the resin body 1, each connecting respective points defining a width of one extending portion 4 and a width of another diagonally located extending portion 4. In both a structure with the through-holes 40 or 41 and a structure with the through-grooves 42 or 43, shapes of the two metal parts 2 symmetrical to each other allows for preventing misalignment in reflow, and thus are preferable. It is preferable that the through-holes 40 and 41 and through-grooves 42 and 43 respectively has an area smaller than an area of a respective one of the extending portions 4 in view of strength.

Further, as the light emitting device 100B1 shown in FIG. 17D, the through-holes 40 (or through-holes 41, or through-grooves 42 or 43) can also be formed in the extending portions 4B of the die-pads 3 of the light emitting device 100B, at similar locations described above.

In the light emitting device 100B1, the through holes 40 are formed in the die-pads 3 such that at least a portion of each of the through-holes 40 is located overlap with a substantially rectangular-shaped region of the corresponding die-pad 3 adjacent to the base-end portion of the corresponding extending portion 4B, or is located between width-lines of the respective one of the extending portions 4B, each of the width-lines being an imaginary line connecting corresponding peripheral portions of the base-end portions of opposite extending portions 4B that are opposite over the two metal parts 2. With the through-holes 40 (or through-holes 41, or through-grooves 42 or 43) with structure and positions as described above, misalignment of the light emitting device 100B1 during reflow can be prevented.

Formation of the through-holes 40 or 41 or the through-grooves 42 or 43 shown in FIG. 16C and FIGS. 17A to 17C are performed together with punching processing of a flat metal plate when providing a lead frame 20, in a step of providing a lead frame. The through-holes 40 or 41 or the through-grooves 42 or 43 are formed so that a surface of a resin of the resin body 1 and a surface of the metal plate are substantially in the same plane when forming the resin bodies 1, in a step of molding. Other steps in a method of manufacturing the light emitting devices 100C1 to 100C3 and 100B1 can be performed in manners as those described above.

It is to be understood that although the present invention has been described with regard to certain embodiments thereof, various other embodiments and variants may occur to those skilled in the art, which are within the scope and spirit of the invention, and such other embodiments and variants are intended to be covered by the following claims.

What is claimed is:

1. A light emitting device comprising:
a plurality of light emitting elements; and
a package, the package comprising
two metal parts on which the plurality of light emitting elements are disposed, and
a resin body securing the two metal parts, the resin body having an outer peripheral shape in top view, said outer peripheral shape having four sides and four connecting parts alternately connected to one another in the top view, in which two adjacent sides of the four sides are perpendicular to each other and are connected by the connecting parts,
wherein each of the two metal parts includes a die-pad on which one or more of the plurality of light emitting elements are disposed, and two extending portions extending laterally in the same direction from the die-pad, wherein
in the top view, an end portion of each of the two extending portions is protruded laterally outward from a respective one of the connecting parts of the resin body, wherein
in the top view, the end portion of each of the two extending portions is located inward of virtual extension lines of corresponding two sides of the resin body, and wherein
in the top view, each of the extending portions has an end surface parallel to a corresponding one of the sides of the resin body.

2. The light emitting device according to claim 1, wherein the two die-pads are symmetrical to each other in the top view.

3. The light emitting device according to claim 1, wherein the same number of light emitting elements are configured on each of the die-pads.

4. The light emitting device according to claim 1, wherein,
in the top view,
the outer peripheral shape comprises a substantially octagonal outer peripheral shape,
the four sides comprises four long sides, and
the four connecting parts comprise four inclined short sides, each of the four inclined short sides having a length smaller than a length of each of the four long sides and being inclined with respect to adjacent ones of the long sides, and wherein
the end portion of each of the extending portions is protruded laterally outward from a respective one of the four inclined short sides.

5. The light emitting device according to claim 1, wherein the four sides comprise two pairs of long sides opposite to one another, and wherein the four connecting parts comprise
four circular arcs passing inside of an octagon with apexes that are ends of the long sides, each of the four circular arcs connected to corresponding two long sides which are perpendicular to each other, and wherein
the end portion of each of the extending portions is protruded laterally outward from a respective one of the four circular arcs.

6. The light emitting device according to claim 1, wherein, the resin body has a circular inner periphery surrounding the plurality of light emitting elements.

7. The light emitting device according to claim 1, wherein the resin body is provided with a mark indicating a polarity at one of the two die-pads.

8. The light emitting device according to claim 1, wherein each of the extending portions further includes a base-end portion, and has a width of the end portion greater than a width of the base-end portion.

9. A method of manufacturing a light emitting device, the method comprising:
providing a lead frame including a metal frame, one or more pairs of die-pads, and one or more pairs of extending portions, each pair of extending portions extending in the same direction from each of the die-pads toward the metal frame;
molding resin bodies each securing a respective pair of the one or more pairs of die-pads, each of the resin bodies having an outer peripheral shape in top view, said outer peripheral shape having four sides and four connecting parts alternately connected to one another in a top view, wherein two adjacent sides are perpendicular to each other and are connected by the connecting parts;
placing light emitting elements on the one or more pairs of die-pads;
sealing the light emitting elements; and
cutting the lead frame;
wherein, in the molding resin bodies, the resin bodies are molded such that an end portion of each of the extending portions is protruded laterally outward from a corresponding one of the connecting parts of each of the resin bodies, and wherein
in the cutting the lead frame, cutting is performed without separating the extending portions from the die pads at the one or more pairs of extending portions such that, in a top view, the end portions of each extending portion is located inward of extension lines of corresponding two sides of the resin body, without cutting the resin bodies and in the top view, each of the extending portions has an end surface parallel to a corresponding one of the sides of the resin body.

10. The method of manufacturing the light emitting device according to claim 9, wherein, in the step of providing the lead frame, the lead frame in which each pair of the one or more pairs of die-pads are symmetrical to each other in a top view is provided.

11. The method of manufacturing the light emitting device according to claim 9, wherein, in the step of placing the light emitting elements, a same number of light emitting elements are configured on each die-pad of the one or more pairs of die-pads.

12. The method of manufacturing the light emitting device according to claim 9, wherein, in the step of molding the resin bodies, the resin bodies are molded so that, in a top view, each of the resin bodies has a substantially octagonal outer peripheral shape, and the four sides comprise two pairs of long sides and wherein the four connecting parts comprise four inclined short sides, each of the four inclined short sides having a length smaller than a length of each of the four long sides and being inclined with respect to a respective one of the long sides, and the end portion of each of the extending portions is protruded laterally outward from a respective one of the four inclined short sides.

13. The method of manufacturing the light emitting device according to claim 12, wherein, in the step of cutting the lead frame, the lead frame is cut in a direction not parallel to any one of the inclined short sides of each of the resin bodes.

14. The method of manufacturing the light emitting device according to claim 9, wherein,
in the step of molding the resin bodies,
the resin bodies are molded so that, in a top view,
the four long sides comprise two pairs of long sides opposite to one another, and wherein the four connecting parts comprise
four circular arcs passing inside of an octagon with apexes that are at ends of the four long sides, each of the four circular arcs connected to corresponding pairs of long sides which are perpendicular to each other, and wherein
the end portion of each of the extending portions is protruded laterally outward from a respective one of the four circular arcs.

15. The method of manufacturing the light emitting device according to claim 9, wherein, in the step of molding the resin bodies, the resin bodies are molded so that, in a top view, each of the resin bodies has a circular inner periphery surrounding the plurality of light emitting elements.

16. The method of manufacturing the light emitting device according to claim 9, wherein, in the step of cutting the lead frame, cutting of the lead frame is performed in a single direction and at equivalent locations relative to the respective resin bodies such that each extending portion of the one or more pairs of extending portions has a single cut surface.

17. The method of manufacturing the light emitting device according to claim 9, further comprising housing a light emitting device, obtained by the step of cutting the lead frame, into an embossed carrier tape.

18. A light emitting device comprising:
a plurality of light emitting elements; and
a package, the package comprising
two metal parts on each of which corresponding ones of the plurality of light emitting elements are disposed, each of the two metal parts including
a die-pad on which corresponding one or more of the plurality of light emitting elements are disposed, and
two extending portions extending in the same direction from the die-pad and each including an end portion and a base-end portion,
the die-pad defining through-holes or through-grooves extending in a thickness direction of the die-pad, each of the through-holes or through-grooves formed in a predetermined region of the die-pad, the predetermined region of the die-pad adjacent to the base-end portion of a respective one of the two extending portions, and the package further comprising
a resin body securing the two metal parts and, in a top view, having an outer peripheral shape, said outer peripheral shape having four sides and four connecting parts alternately connected to one another such that each of the four connecting parts is connected to corresponding two sides which are perpendicular to each other,
wherein, in a top view, the end portion of each of the two extending portions is protruded laterally outward from a respective one of the connecting parts of the resin body,
wherein, in the top view, the end portion of each of the two extending portions is located inward of extension lines of two sides, adjacent to the respective one of the connecting parts, of the four sides of the resin body, wherein
the through-holes or through-grooves of the die-pad are filled with a resin of the resin body, and wherein
in the top view, each of the extending portions has an end surface parallel to a corresponding one of the sides of the resin body.

19. The light emitting device according to claim 18, wherein the through-hole or the through-groove is formed in the predetermined region of the die-pad so as to be entirely or partially located inward of width-lines, which are two imaginary straight lines that are in parallel to a diagonal line of the resin body, each connecting respective points defining a width of the respective extending portion and a width of another diagonally located extending portion.

20. A method of manufacturing a light emitting device, the method comprising:
providing a lead frame including a metal frame, one or more pairs of die-pads, and one or more pairs of extending portions, each pair of the extending portions extending in the same direction from each of the die-pads toward the metal frame, each of die-pads defining through-holes or through-grooves extending in a thickness direction of the die-pad, each of the through-holes or through-grooves formed in a predetermined region of the die-pad, the predetermined region of the die-pad adjacent to a base-end portion of a respective one of the two extending portions;
molding resin bodies each securing a respective pair of the one or more pairs of die-pads, each of the resin bodies having an outer peripheral shape in top view, said outer peripheral shape having four sides and four connecting parts alternately connected to one another, in which two adjacent sides are perpendicular to each other and are connected to the connecting parts;
placing light emitting elements on the one or more pairs of die-pads;
sealing the light emitting elements; and
cutting the lead frame;
wherein, in the molding resin bodies, the resin bodies are molded such that an end portion of each extending portion is protruded laterally outward from a corresponding one of the connecting parts of each of the resin bodies and such that the through-holes or through-grooves of each die-pad are filled with a resin of a respective one of the resin bodies, and wherein
in the cutting lead frame, cutting is performed without separating the extending portions from the die-pads at the one or more pairs of extending portions such that, in a top view, the end portions of each extending portion is located inward of extension lines of corresponding two sides of the resin body, without cutting the resin bodies and in the top view, each of the extending portions has an end surface parallel to a corresponding one of the sides of the resin body.

21. The light emitting device according to claim 1, wherein a number of the extending portions is four, and wherein
in a top view, each of the four extending portions is located at a respective one of four corner portions of the package.

22. The light emitting device according to claim 18, wherein a number of the extending portions is four, and wherein
in a top view, each of the four extending portions is located at a respective one of four corner portions of the package.

* * * * *

UNITED STATES PATENT AND TRADEMARK OFFICE
CERTIFICATE OF CORRECTION

| | |
|---|---|
| PATENT NO. | : 10,873,015 B2 |
| APPLICATION NO. | : 16/288464 |
| DATED | : December 22, 2020 |
| INVENTOR(S) | : Hiroaki Ukawa et al. |

It is certified that error appears in the above-identified patent and that said Letters Patent is hereby corrected as shown below:

On the Title Page

In Item (30):
Please add the Foreign Application Priority Data, as follows:
--Mar. 1, 2018 (JP) .............................2018-036791
Jun. 1, 2018 (JP) .............................2018-106395--

Signed and Sealed this
Twenty-third Day of January, 2024

Katherine Kelly Vidal
*Director of the United States Patent and Trademark Office*